United States Patent
Fukuura

(10) Patent No.: US 9,714,461 B2
(45) Date of Patent: Jul. 25, 2017

(54) METHOD FOR PRODUCING METAL-BASED PARTICLE ASSEMBLY

(71) Applicant: SUMITOMO CHEMICAL COMPANY, LIMITED, Tokyo (JP)

(72) Inventor: Tomohiro Fukuura, Tsukuba (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 14/428,521

(22) PCT Filed: Sep. 2, 2013

(86) PCT No.: PCT/JP2013/073534
§ 371 (c)(1),
(2) Date: Mar. 17, 2015

(87) PCT Pub. No.: WO2014/045852
PCT Pub. Date: Mar. 27, 2014

(65) Prior Publication Data
US 2015/0225842 A1    Aug. 13, 2015

(30) Foreign Application Priority Data
Sep. 19, 2012 (JP) ................... 2012-205663

(51) Int. Cl.
C23C 14/58    (2006.01)
B22F 9/04    (2006.01)
(Continued)

(52) U.S. Cl.
CPC ........ *C23C 14/5806* (2013.01); *B22F 1/0018* (2013.01); *B22F 9/04* (2013.01);
(Continued)

(58) Field of Classification Search
None
See application file for complete search history.

(56) References Cited

U.S. PATENT DOCUMENTS 5,866,433 A    2/1999    Schalkhammer et al.
6,171,676 B1    1/2001    Mukai et al.
(Continued)

FOREIGN PATENT DOCUMENTS

JP    08-271431 A    10/1996
JP    09259425 A    10/1997
(Continued)

OTHER PUBLICATIONS

K. Lance Kelly et al., "The Optical Properties of Metal Nanoparticles: The Influence of Size, Shape, and Dielectric Environment" The Journal of Physical Chemistry B, 2003, pp. 668-677, vol. 107.

(Continued)

*Primary Examiner* — Erma Cameron
(74) *Attorney, Agent, or Firm* — Sughrue Mion, PLLC

(57) ABSTRACT

There is provided a method for producing a metal-based particle assembly, comprising the steps of: producing a metal-based film having an average thickness equal to or smaller than 50 nm on a substrate (a first step); and morphologically changing the metal-based film through a heat treatment into a metal-based particle assembly comprising a plurality of metal-based particles mutually separated and disposed in two dimensions (a second step). The method allows a metal-based particle assembly to be produced that for example includes 30 or more metal-based particles having an average particle diameter in a range of from 200 to 1600 nm, an average height in a range of from 55 to 500

(Continued)

nm, and an aspect ratio, as defined by a ratio of the average particle diameter to the average height, in a range of from 1 to 8.

11 Claims, 19 Drawing Sheets

(51) Int. Cl.

| | | |
|---|---|---|
| *H01L 51/52* | (2006.01) | |
| *B22F 1/00* | (2006.01) | |
| *B82Y 30/00* | (2011.01) | |
| *C23C 14/14* | (2006.01) | |
| *H01L 51/44* | (2006.01) | |

(52) U.S. Cl.
CPC .............. *B82Y 30/00* (2013.01); *C23C 14/14* (2013.01); *H01L 51/5268* (2013.01); *H01L 51/447* (2013.01)

(56) References Cited

U.S. PATENT DOCUMENTS

| | | | |
|---|---|---|---|
| 2002/0145735 A1 | 10/2002 | Tominaga et al. | |
| 2004/0048075 A1 | 3/2004 | Tominaga et al. | |
| 2005/0218540 A1* | 10/2005 | Sastry .................. | B22F 1/0018 264/10 |
| 2007/0115474 A1 | 5/2007 | Chaton et al. | |
| 2008/0085594 A1* | 4/2008 | Li ........................ | B22F 1/0062 438/597 |
| 2009/0027668 A1 | 1/2009 | Fujimaki et al. | |
| 2009/0213368 A1* | 8/2009 | Roper .................. | B22F 1/0018 356/300 |
| 2010/0034693 A1* | 2/2010 | Li ........................ | B22F 1/0018 420/501 |
| 2010/0200876 A1* | 8/2010 | Pan ..................... | H01L 25/0753 257/91 |
| 2014/0011043 A1 | 1/2014 | Fukuura | |
| 2014/0017507 A1 | 1/2014 | Fukuura | |
| 2014/0037977 A1 | 2/2014 | Fukuura | |
| 2015/0243931 A1* | 8/2015 | Fukuura .............. | H01L 51/5268 257/98 |

FOREIGN PATENT DOCUMENTS

| | | |
|---|---|---|
| JP | 2002-277397 A | 9/2002 |
| JP | 2004020822 A | 1/2004 |
| JP | 2006061748 A | 3/2006 |
| JP | 2006-208271 A | 8/2006 |
| JP | 2007-139540 A | 6/2007 |
| JP | 2013-177665 A | 9/2013 |
| JP | 2013-178448 A | 9/2013 |
| JP | 2013-179016 A | 9/2013 |
| WO | 2005/033335 A2 | 4/2005 |

OTHER PUBLICATIONS

T. Fukuura et al., "Long Range Enhancement of Molecular Fluorescence by Closely Packed Submicro-scale Ag Islands", e-Journal of Surface Science and Nanotechnology, 2009, pp. 653-659, Vo. 7.
International Search Report for PCT/JP2013/073534 dated Oct. 15, 2013.
Communication dated Dec. 8, 2015, from the Japanese Patent Office in counterpart application No. 2012-205663.
Communication dated Sep. 9, 2016 from the Taiwanese Intellectual Property Office in counterpart Application No. 102132938.
Communication dated Mar. 21, 2017, from the Japanese Patent Office in counterpart Japanese application No. 2016-058216.

\* cited by examiner

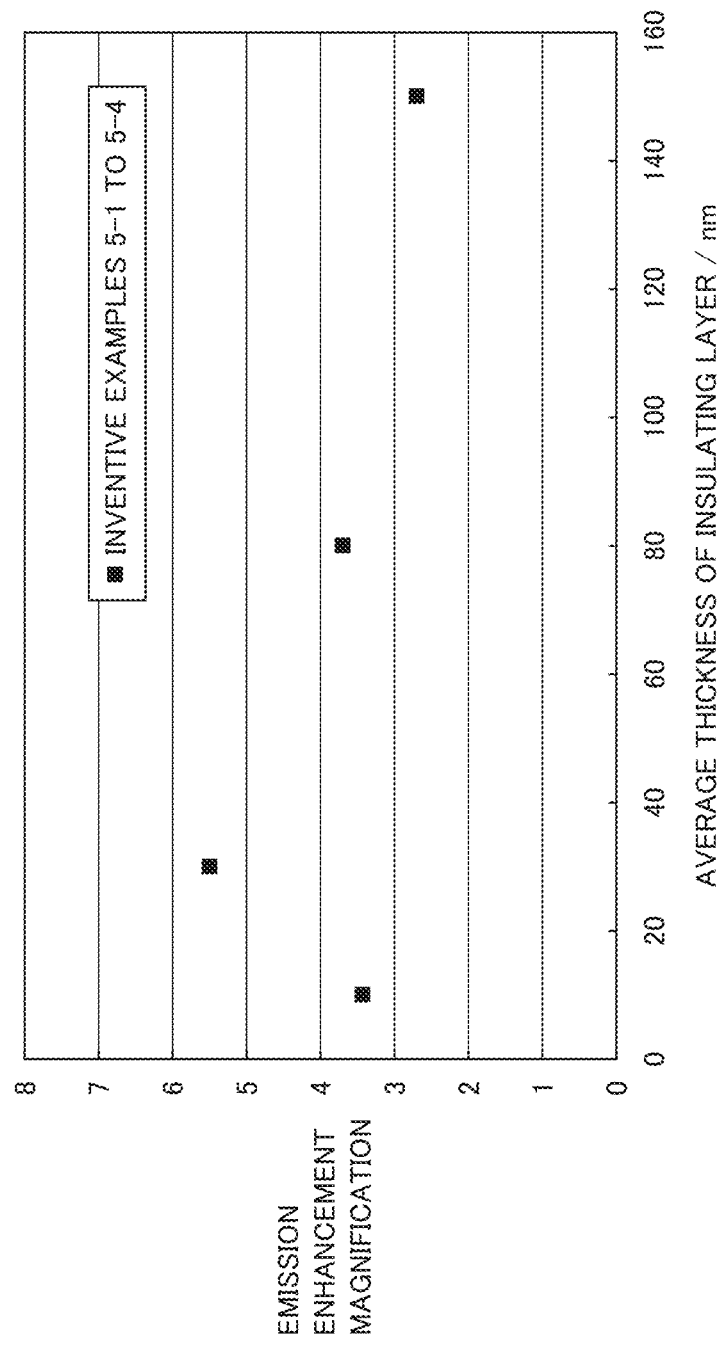

METHOD FOR PRODUCING METAL-BASED PARTICLE ASSEMBLY

CROSS REFERENCE TO RELATED APPLICATIONS

This application is a National Stage of International Application No. PCT/JP2013/073534 filed Sep. 2, 2013, claiming priority based on Japanese Patent Application No. 2012-205663, filed Sep. 19, 2012, the contents of all of which are incorporated herein by reference in their entirety.

TECHNICAL FIELD

The present invention relates to a method for producing a metal-based particle assembly comprising a plurality of metal-based particles mutually separated and disposed in two dimensions.

BACKGROUND ART

It has conventionally been known that making metal particles small to be nano-sized presents functions that are not observed when they are in a bulk state, and localized plasmon resonance is in particular expected for application. Plasmon is a compressional wave of free electrons that arises by collective oscillation of the free electrons in a metallic nanostructure.

In recent years, a field of art handling the plasmon is referred to as plasmonics and attracts large attention, and has also been actively studied and such study includes exploiting phenomena of localized plasmon resonance of a metal nanoparticle to be intended for improvements of light emitting devices in luminous efficiency and improvements of photoelectric conversion devices (solar cell devices and the like) in conversion efficiency.

Japanese Patent Laying-Open Nos. 2007-139540 (PTD 1) and 08-271431 (PTD 2) and WO2005/033335 (PTD 3), for example, disclose techniques exploiting localized plasmon resonance for enhanced fluorescence. Furthermore, T. Fukuura and M. Kawasaki, "Long Range Enhancement of Molecular Fluorescence by Closely Packed Submicro-scale Ag Islands", e-Journal of Surface Science and Nanotechnology, 2009, 7, 653 (NPD 1) indicates a study on localized plasmon resonance of silver nanoparticles.

CITATION LIST

Patent Documents

PTD 1: Japanese Patent Laying-Open No. 2007-139540
PTD 2: Japanese Patent Laying-Open No. 08-271431
PTD 3: WO2005/033335

Non Patent Document

NPD 1: T. Fukuura and M. Kawasaki, "Long Range Enhancement of Molecular Fluorescence by Closely Packed Submicro-scale Ag Islands", e-Journal of Surface Science and Nanotechnology, 2009, 7, 653.

SUMMARY OF INVENTION

Technical Problem

PTD 1 discloses providing a large number of mutually independent tabular metal particles (fluorescence enhancement devices) on a substrate by DC sputtering at a prescribed film deposition rate to deposit tabular silver particles. PTD 2 discloses that an island of metal (or metal particle) can be produced on a base material through vapor deposition.

PTD 3 discloses employing electronic lithography as a method for providing on a base material a plurality of metal pads (in the form of cylindrical projections) generating plasmon resonance. NPD 1 discloses providing a particle assembly composed of a large number of mutually independent silver particles on a substrate by: sputtering; spin-coating a silver particle dispersion and subsequently performing a heat treatment (or annealing); and the like.

However, it has been difficult or impossible to employ the above disclosed conventional methods to produce a satisfactorily controlled metal-based particle assembly having a desired shape (or having metal-based particles having a desired shape, a desired interparticle distance, and the like) conforming to for what it is used.

The present invention has been made in view of the above issue, and an object thereof is to provide a method that can produce a satisfactorily controlled metal-based particle assembly having a shape suitable for what it is used.

Solution to Problem

The present invention includes a method for producing a metal-based particle assembly, as described below.

[1] A method for producing a metal-based particle assembly, comprising the steps of:
producing a metal-based film having an average thickness equal to or smaller than 50 nm on a substrate (a first step); and
performing a heat treatment to morphologically change said metal-based film into a metal-based particle assembly comprising a plurality of metal-based particles mutually separated and disposed in two dimensions (a second step).

[2] The method for producing a metal-based particle assembly according to item [1], wherein said heat treatment is performed at a temperature equal to or higher than 280° C.

[3] The method for producing a metal-based particle assembly according to item [1] or [2], wherein said first step includes the step of applying a coating liquid on said substrate, said coating liquid containing particles made of a metal-based material that constitutes said metal-based film.

[4] The method of producing a metal-based particle assembly according to item [3], wherein said coating liquid contains said particles at a concentration of 0.1-7% by weight.

[5] The method for producing a metal-based particle assembly according to item [1] or [2], wherein said first step includes the step of producing said metal-based film on said substrate through vapor deposition.

[6] The method for producing a metal-based particle assembly according to any one of items [1] to [5], wherein a series of steps including said first step followed by said second step is repeated at least twice.

[7] The method for producing a metal-based particle assembly according to any one of items [1] to [6], wherein:
said metal-based particle assembly includes 30 or more said metal-based particles; and
said metal-based particles have an average particle diameter in a range of from 200 to 1600 nm, an average height in a range of from 55 to 500 nm, and an aspect ratio, as defined by a ratio of said average particle diameter to said average height, in a range of from 1 to 8, and said metal-based particles are disposed such that immediately adjacent ones thereof have an average distance therebetween (hereinafter also referred to as "average interparticle distance") in a range of from 1 to 150 nm.

[8] The method for producing a metal-based particle assembly according to any one of items [1] to [6], wherein:
said metal-based particle assembly includes 30 or more said metal-based particles; and
said metal-based particles have an average particle diameter in a range of from 200 to 1600 nm, an average height in a range of from 55 to 500 nm, and an aspect ratio, as defined by a ratio of said average particle diameter to said average height, in a range of from 1 to 8; and
said metal-based particle assembly has in an absorption spectrum for a visible light region a maximum wavelength of a peak at a longest side in wavelength, and the maximum wavelength shifts toward a shorter side in wavelength in a range of from 30 to 500 nm as compared with that of a reference metal-based particle assembly in which metal-based particles having a particle diameter equal to said average particle diameter and a height equal to said average height and being identical in material to those of the former metal-based particle assembly are disposed such that each distance between adjacent metal-based particles may be in a range of from 1 to 2 μm.

[9] The method for producing a metal-based particle assembly according to any one of items [1] to [6], wherein:
said metal-based particle assembly includes 30 or more said metal-based particles;
said metal-based particles have an average particle diameter in a range of from 200 to 1600 nm, an average height in a range of from 55 to 500 nm, and an aspect ratio, as defined by a ratio of said average particle diameter to said average height, in a range of from 1 to 8; and
said metal-based particle assembly has in an absorption spectrum for a visible light region a maximum wavelength of a peak at a longest side in wavelength, and an absorbance at said maximum wavelength is higher as compared with that of a reference metal-based particle assembly in which metal-based particles having a particle diameter equal to said average particle diameter and a height equal to said average height and being identical in material to those of the former metal-based particle assembly are disposed such that each distance between adjacent metal-based particles may be in a range of from 1 to 2 μm, on the premise that the numbers of said metal-based particles are the same.

[10] The method for producing a metal-based particle assembly according to any one of items [1] to [9], wherein said metal-based particles are made of noble metal.

[11] The method for producing a metal-based particle assembly according to item [10], wherein said metal-based particles are made of silver.

Advantageous Effect of Invention

The present production method can thus be employed to produce a satisfactorily controlled metal-based particle assembly having a desired shape (or having metal-based particles having a desired shape, a desired interparticle distance, and the like) conforming to for what it is used.

The present production method is excellent in controlling a metal-based particle assembly in shape, and can provide an enhancement element for an optical device that can improve a light emitting device (an organic electroluminescence (EL) device, an inorganic EL device, an inorganic light emitting diode (LED) device, a quantum dot light emitting device, and the like) in luminous efficacy and a photoelectric conversion device (a solar cell device and the like) in conversion efficiency significantly more than conventional.

BRIEF DESCRIPTION OF DRAWINGS

FIG. 15 shows an emission enhancement effect in the photoexcited light emitting devices of Inventive Example 5-1 to 5-4.

DESCRIPTION OF EMBODIMENTS

<Method for Producing Metal-Based Particle Assembly>

The present invention relates to a method for producing a metal-based particle assembly. In the present invention, a "metal-based particle assembly" means an assembly of a plurality of metal-based particles (particles made of a metal-based material) mutually separated and disposed in two dimensions. In contrast to conventional methods, the present production method can be employed to produce a satisfactorily controlled metal-based particle assembly having a desired shape (or having metal-based particles having a desired shape, a desired average interparticle distance, and the like) conforming to for what it is used.

The above metal-based particle's "shape" indicates an "average particle diameter", "average height", and "aspect ratio" of a metal-based particle that constitutes the metal-based particle assembly. The metal-based particle's "average particle diameter", "average height", "aspect ratio", and "average interparticle distance" are defined as will be described hereinafter.

The present invention provides a method for producing a metal-based particle assembly, including the steps of:

(A) producing a metal-based film having an average thickness of 50 nm or smaller on a substrate (hereafter also referred to as a metal-based film formation step (or a first step)); and (B) applying a heat treatment to morphologically change the metal-based film into a metal-based particle assembly (hereafter also referred to as a metal-based particle assembly formation step (or a second step)). Hereinafter, reference will be made to FIGS. 1A and 1B to specifically describe each step.

(A) Metal-Based Film Formation Step

Figure 1A:
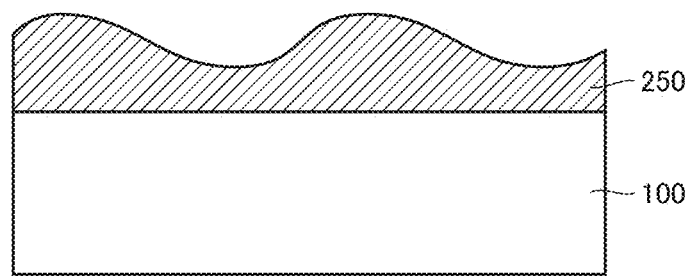
FIGS. 1A, 1B and 1C are schematic cross sections for illustrating the steps of producing a metal-based film and producing a metal-based particle assembly that the method for producing of a metal-based particle assembly according to the present invention includes.
Figure 1B:
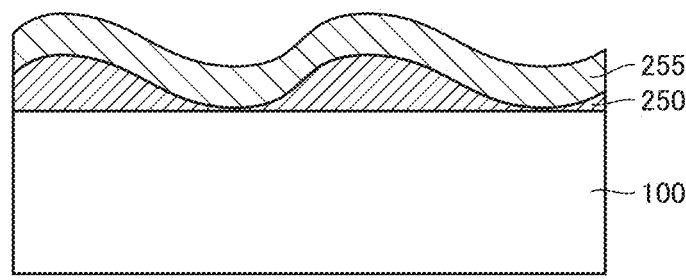
Figure 1C:
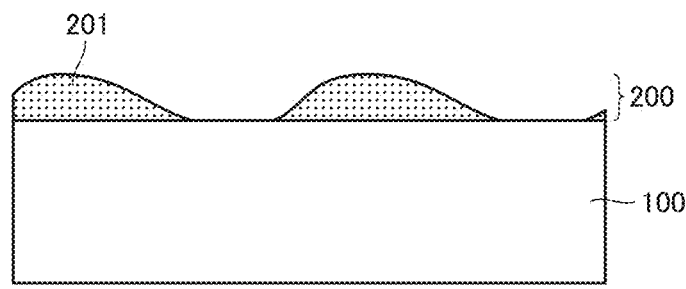

FIG. 1A is a schematic cross section for illustrating the metal-based film formation step, and FIGS. 1B and 1C are schematic cross sections for illustrating the subsequent, metal-based particle assembly formation step (B). With reference to FIG. 1(a), the metal-based film formation step produces a metal-based film 250 having an average thickness of 50 nm or smaller (a film made of a metal-based material) on a substrate 100. "Average thickness" as referred to herein is measured as follows: an object having a pointed tip, such as tweezers, a needle or the like, is used to exfoliate an external surface of metal-based film 250 in a line to provide a flaw thereto to reach substrate 100, and in that line, an AFM image including a cross section of metal-based film 250 and an interface of metal-based film 250 and substrate 100 is obtained, and used to obtain a distance from a surface of substrate 100 that is adjacent to metal-based film 250 to the external surface of metal-based film 250 randomly at 10 points, and the distances obtained at the 10 points are averaged to obtain the average thickness.

Performing the subsequent, metal-based particle assembly formation step (B) to morphologically change metal-based film 250 throughout its entire region substantially completely into a metal-based particle assembly requires metal-based film 250 to have an average thickness of 50 nm or smaller. Metal-based film 250 has an average thickness preferably of 40 nm or smaller, more preferably 30 nm or smaller, and still more preferably 20 nm or smaller. When metal-based film 250 has an average thickness exceeding 50 nm, and metal-based particle assembly formation step (B) is performed with a heat treatment performed at some temperature or the like, metal-based film 250 may be able to be partially changed morphologically into a metal-based particle assembly, however, at least a major portion of metal-based film 250 would become a continuous film, and it is thus difficult to convert metal-based film 250 throughout its entire region into a metal-based particle assembly. While it depends on the temperature of the heat treatment of metal-based particle assembly formation step (B), generally, metal-based film 250 having a larger average thickness provides a metal-based particle assembly formed of metal-based particles having a larger average particle diameter and a larger average height.

Metal-based film 250 preferably has an average thickness of 40 nm or smaller, more preferably 30 nm or smaller, and still more preferably 20 nm or smaller because having a prescribed shape (or having metal-based particles with a prescribed shape, a prescribed average interparticle distance and the like) allows a satisfactorily controlled metal-based particle assembly to be produced that has unique characteristics, such as presenting significantly more intense plasmon resonance than conventional, and is suitable as an enhancement element for an optical device including a light emitting device, a photoelectric conversion device and the like.

While metal-based film 250 may have average thickness with any lower limit value, metal-based film 250 preferably has an average thickness of 5 nm or larger, more preferably 10 nm or larger, and still more preferably 15 nm or larger to achieve a prescribed shape that the metal-based particle assembly suitable as an enhancement element for an optical device, as described above, has (i.e., metal particles having an average particle diameter of 200-1600 nm, an average height of 55-500 nm, an aspect ratio of 1-8, and furthermore, an average interparticle distance of 1-150 nm, which will be described for their characteristics in shape more specifically hereinafter). Note, however, that when a series of steps including metal-based film formation step (A) and metal-based particle assembly formation step (B) is repeated twice or more to produce a metal-based particle assembly, then, metal-based film 250 may have an average thickness with a lower limit value smaller than the above preferable lower limit value for each time when the series of steps is performed.

Metal-based film 250 is provided on substrate 100 in a method preferably for example by applying a coating liquid that contains particles identical in material to the metal-based particles that constitute metal-based film 250. Note that hereinafter the former particles will be distinguished from the latter particles, and will also be simply referred to as "particles." The coating liquid is typically a liquid including the above particles and a solvent in which the particles are dispersed. When the coating liquid contains a solvent or the like, the coating film is dried before step (B) if necessary.

The coating liquid may be applied for example by spin coating, bar coating, gravure coating, micro gravure coating, roll coating, rod coating, knife coating, air knife coating, kiss coating, die coating, or other conventionally known methods, and inter alia, spin coating is preferable as it can provide metal-based film 250 significantly uniformly in thickness. On the other hand, gravure coating or similar web coating is preferable as it allows roll deposition and is excellent in productivity. The coating liquid may be applied twice or more as required (for example to achieve a desired average thickness).

As has been set forth above, the coating liquid typically includes the above particles and a solvent. The coating liquid may be a commercially available coating liquid, or alternatively, may be the commercially available coating liquid with a surfactant or a similar additive, a diluting solvent and/or the like added thereto for preparation. As a matter of course, a dispersion liquid prepared with particles and an optionally added additive added to a solvent may be used as the coating liquid. The solvent can be a variety of types of organic solvents, water or similar aqueous solvents, or a mixture thereof. The particles may be any particles that include a metal-based material that constitutes metal-based film 250, and while the particles may have a surface processed or similarly modified, the particles may be unmodified and formed only of the metal-based material. The present method is also advantageous in that it allows typical, unmodified particles (e.g., a liquid having generally commercially available, unmodified particles dispersed therein) to be also used.

The coating liquid contains the above particles with an average particle diameter normally of 1-50 nm, more typically 1-40 nm, preferably 1-20 nm. The range of 1-50 nm facilitates obtaining metal-based film 250 having an average thickness of 50 nm or smaller, although it depends on the particles' concentration in the coating liquid. Note that if the particles have an average particle diameter exceeding 50 nm, it is still possible to obtain metal-based film 250 having an average thickness of 50 nm or smaller, and accordingly, particles having an average particle diameter exceeding 50 nm can also be used.

The coating liquid contains the above particles preferably at a concentration of 0.1-7% by weight. When the coating liquid with the above particles contained therein at a concentration larger than 7% by weight is applied in the above exemplified typical manner, with the particles having some average particle diameter and the coating liquid applied in some manner (including spin coating, bar coating and other types of coating methods, and spin coating's revs, roll coating's line velocity, and other coating conditions), there a tendency that applying the coating liquid only once would result in an average thickness exceeding 50 nm. The particles have a concentration with an upper limit value preferably of 5% by weight. The coating liquid that contains the particles at a concentration of 0.1-7% by weight is also preferable in that it can be applied throughout its coating area without an excessively coated portion or an insufficiently coated portion and hence substantially uniformly. This further ensures that metal-based film 250 has its region entirely converted into the metal-based particle assembly.

If the particles have extremely low concentration, metal-based film 250 will be extremely sparse in density, and applying the coating liquid only once allows the metal-based material to be carried on the substrate in only a small amount, and it is thus difficult to obtain a metal-based particle assembly having closely disposed metal-based particles. Accordingly, to obtain a metal-based particle assembly having metal-based particles closely disposed (for example having an average interparticle distance of 1-150 nm) and having unique characteristics, such as presenting significantly more intense plasmon resonance than conventional, the particles preferably have a concentration of 0.1% by weight or larger, as has been discussed above. Note, however, that when metal-based film formation step (A) is performed with the coating liquid applied twice or more or a series of steps including metal-based film formation step (A) and metal-based particle assembly formation step (B) is repeated twice or more to produce a metal-based particle assembly, then, the coating liquid can be applied for each time with the particles having a concentration smaller than 0.1% by weight.

The coating liquid contains the particles preferably at a concentration of 0.25% by weight or larger, more preferably, 0.8% by weight or larger. This allows a metal-based particle assembly to be obtained that has metal-based particles closely disposed and is, furthermore, significantly suitable as an enhancement element for an optical device to present a high plasmon resonance effect if each metal-based film formation step (A) is performed such that applying the coating liquid is repeated a reduced number of times (for example twice or the like) or a series of steps including metal-based film formation step (A) and metal-based particle assembly formation step (B) is repeated a reduced number of times (for example twice or the like). Repeating the application of the coating liquid a reduced number of times and repeating the series of steps a reduced number of times are also advantageous in providing metal-based film 250 uniformly in thickness.

On the other hand, applying the coating liquid by web coating facilitates depositing uniform metal-based film 250 having an average thickness of 50 nm or smaller, and accordingly, it is more preferable that the coating liquid contain the particles at a concentration of 0.15% by weight or smaller.

Thus in the present invention it is important to have metal-based film 250 to have an average thickness equal to or smaller than a prescribed thickness to produce a satisfactorily controlled metal-based particle assembly having a desired shape (or having metal-based particles having a desired shape, a desired interparticle distance, and the like) conforming to for what it is used. To achieve the prescribed average thickness, the present invention allows a coating liquid to be applied in a variety of coating methods such as listed above. The coating liquid contains particles at a concentration selected as appropriate to achieve the prescribed average thickness depending on the coating method applied. In other words, if the coating liquid has a specific particle concentration that is unsuitable for a coating method, the present invention allows another coating method to be employed so that the coating liquid can produce a satisfactorily controlled metal-based particle assembly having a desired shape. Furthermore, the present method is also advantageous in that it can adopt web coating or a similar highly productive coating method.

Metal-based film 250 is provided on substrate 100 in another preferable method for example by vapor-depositing a metal-based material on substrate 100. In that case, deposition rate, deposition time and the like can be adjusted to obtain metal-based film 250 having an average thickness of 50 nm or smaller. It preferably has an average thickness similar to that discussed above.

Metal-based film 250 can also be provided on substrate 100 by sputtering, plating or the like.

The metal-based particle assembly preferably has metal-based particles constituted of a metal-based material (constituting metal-based film 250) that is a material presenting a plasmon resonance peak appearing in an ultraviolet to visible light region in absorption spectrum measurement through absorptiometry when the material is presented in the form of nanoparticles or an assembly of such particles (hereinafter also simply referred to as "plasmon peak"), and the material can include, for example: noble metals such as gold, silver, copper, platinum and palladium; metals such as aluminum and tantalum; alloys containing these noble metals or these metals; and metal compounds including these noble metals or these metals (such as metal oxides and metal salts). Inter alia, noble metals such as gold, silver, copper, platinum and palladium are preferable, and silver is more preferable as it is inexpensive and provides small absorption (or has a small imaginary part of a dielectric function in visible light wavelengths). It should be noted, however, that it is preferable that the type of the metal-based material be selected as appropriate depending on how the metal-based particle assembly is used (e.g., to what type of optical device the metal-based particle assembly is applied as an enhancement element for the optical device by utilizing the metal-based particle assembly's plasmon resonance effect), the wavelengths of the peaks of the absorption, emission and reflection spectra of an active layer of the optical device to be enhanced, and the like.

Substrate 100 can be made of material selected from a wide range, and inter alia, it is preferable to use a substrate of a non-conductive material when the substrate has the metal-based particle assembly layered thereon (hereinafter this substrate will also be referred to as a "metal-based particle assembly-layered substrate") and the metal-based particle assembly-layered substrate is applied as an enhancement element for an optical device to exploit its plasmon resonance effect. This is because a substrate allowing some or all metal-based particles to pass and receive electrons therebetween results in a reduced plasmon resonance effect. The non-conductive material can include glass, a variety of inorganic insulating materials ($SiO_2$, $ZrO_2$, mica, and the like), a variety of plastic materials, and the like. Metal-based film 250 is preferably provided on substrate 100 having a maximally smooth surface.

Furthermore, when the metal-based particle assembly-layered substrate is applied for example as an enhancement element for a light emitting device, it is preferable that the substrate be a translucent substrate, more preferably an optically transparent substrate, as it allows the light emitting device to extract light from a surface of the substrate that is opposite to a surface thereof bearing the metal-based particle assembly thereon.

When the method as described above is employed to provide metal-based film 250 on substrate 100, metal-based film 250 has an external surface that is not completely flat but has recesses and projections of some extent (see FIG. 1A).

(B) Metal-Based Particle Assembly Formation Step

With reference to FIGS. 1B and 1C, the present step subjects metal-based film 250 having an average thickness of 50 nm or smaller to a heat treatment (or anneals it) to morphologically change it into metal-based particle assembly 200. This step provides a major morphological change such that metal-based film 250 has a surface region 255, which typically is heated and thus a metal oxide, thermally decomposed (see FIG. 1B) and metal-based film 250 has a surface with recesses and projections having a trough therebetween with metal-based film 250 interrupted and thus changed morphologically to allow a plurality of mutually independently disposed metal-based particles 201 to form metal-based particle assembly 200 (see FIG. 1C). Furthermore, together with such a major morphological change, there also arise: 1) a morphological change arising when metal-based film 250 that is heated has a surface varied geometrically before it is interrupted; 2) a morphological change arising as metal-based particle 201 formed merges with metal-based particle 201 adjacent thereto to grow; 3) a morphological change arising as metal-based particle 201 formed has a surface region thermally decomposed and is thus ensmallened (or reduced in size); and other secondary morphological changes. Metal-based particle assembly 200 obtained has a shape depending on a condition of the heat treatment, more specifically, to what extent the major and secondary morphological changes contribute to the shape of metal-based particle assembly 200, depending on the condition of the heat treatment.

The heat treatment is preferably performed at 280° C. or higher, and more preferably 285° C. or higher. The heat treatment is normally performed at 600° C. or lower and preferably 580° C. or lower. When the heat treatment is performed at a temperature equal to or higher than that allowing metal-based film 250 to have surface region 255 thermally decomposed (e.g., approximately 150-200° C. when the surface region is made of silver oxide), the above major and secondary morphological changes can arise. When the heat treatment is performed at a temperature lower than 280° C., it may require long time to cause the morphological changes or can only cause the morphological changes for metal-based film 250 having an extremely small average thickness smaller than 30 nm, and there is a tendency that it is difficult to obtain a metal-based particle assembly having a desired shape.

When the heat treatment is performed at a temperature exceeding 600° C., and mutually independent metal-based particles 201 are thus formed, secondary morphological change 3) thereafter arises significantly, which facilitates losing metal-based particles 201 on substrate 100.

The heat treatment can be adjusted in temperature to produce a metal-based particle assembly having a desired shape conforming to for what it is used. For example, when metal-based film 250 has an average thickness of approximately 30 nm or smaller, any one of a heat treatment performed in a low temperature range of approximately 280° C. to approximately 500° C. and a heat treatment performed in a high temperature range of approximately 500° C. to approximately 600° C. allows a metal-based particle assembly to be obtained that presents an intense plasmon peak (or a high plasmon resonance effect). There is a tendency that a heat treatment performed at higher temperature allows a metal-based particle assembly to be obtained that is formed of metal-based particles larger in average particle diameter and average height. Note, however, that when the heat treatment in the high temperature range is performed for an extremely long period of time, and mutually independent metal-based particles 201 are thus formed, secondary morphological change 3) thereafter arises significantly, and finally, metal-based particles 201 can disappear on substrate 100.

For example, when metal-based film 250 has an average thickness exceeding approximately 30 nm and being 50 nm or smaller, the heat treatment performed in the high temperature range of approximately 500° C. to approximately 600° C. allows a metal-based particle assembly to be obtained that presents an intense plasmon peak (or a high plasmon resonance effect). There is a tendency that metal-based film 250 having an average thickness exceeding approximately 30 nm and being 50 nm or smaller undergoing a heat treatment of higher temperature also allows a metal-based particle assembly to be obtained that is formed of metal-based particles larger in average particle diameter and average height. Note, however, that when the heat treatment is performed for an extremely long period of time, and mutually independent metal-based particles 201 are thus formed, secondary morphological change 3) thereafter arises significantly, and finally, metal-based particles 201 can disappear on substrate 100.

The heat treatment is normally performed for several seconds to several hours, preferably for 10 seconds to one hour, more preferably 30 seconds to 30 minutes. When the heat treatment is performed for an extremely short period of time, it results in an insufficient morphological change into a metal-based particle assembly, whereas when the heat treatment is performed for an extremely long period of time, the part of the heat treatment exceeding a period of time required to complete the morphological change wastes a processing time, or after mutually independent metal-based particles 201 are formed, secondary morphological change 3) arises significantly, and metal-based particles 201 can disappear on substrate 100. Furthermore, when a heat treatment is performed at a relatively high temperature for an excessively long period of time, then, even with metal-based film 250 having the same average thickness, secondary morphological change 3) is significant, and as a result, metal-based particle 201 will have an excessively increased average interparticle distance and thus there is a tendency that it is difficult to obtain an intense plasmon resonance effect obtained through metal-based particles 201 closely disposed, and furthermore, when substrate 100 supports thereon a smaller number of metal-based particles 201 than a desired number (i.e. 30), there is also a tendency in this regard that it is difficult to obtain an intense plasmon resonance effect.

The heat treatment may be done in any environment, and it may be done in any of an oxidizing atmosphere, a reducing atmosphere, a vacuum atmosphere and an atmosphere of an inert gas, and it can be done for example in an atmosphere of air. Inter alia, the oxidizing atmosphere, the atmosphere of air in particular, is preferable, as it allows oxidative decomposition (or a metal oxide's thermal decomposition) to be provided to provide morphological change suitably.

In the present invention, it is also preferable that a series of steps including metal-based film formation step (A) followed by metal-based particle assembly formation step (B) be repeated twice or more to produce a metal-based particle assembly. According to this method, supplying a metal-based material to provide metal-based film 250 and subsequently performing a heat treatment to allow metal-based film 250 to have the major and secondary morphological changes can be repeated to grow metal-based particles stepwise so that the metal-based particles' average particle diameter, average height, aspect ratio, and average interparticle distance are more controllable to an extent that would not easily be attained by performing the series of steps only once. Furthermore, performing each metal-based particle assembly formation step (B) with a heat treatment performed for a relatively short period of time (for example of approximately 20-60 seconds) allows metal-based particles to be relatively closely disposed (or can provide a reduced average interparticle distance).

Thus, repeating the series of steps is suitable for producing a metal-based particle assembly required to have a more precisely controlled shape (or metal-based particles having a shape, an average interparticle distance and the like more precisely controlled), that is, a metal-based particle assembly that has unique characteristics, such as presenting significantly more intense plasmon resonance than conventional, and is suitable as an enhancement element for an optical device including a light emitting device, a photoelectric conversion device and the like, as will be described below more specifically.

Note that when repeating the series of steps twice is considered as an example, then, for the first time, it includes steps similar to steps (A) and (B) described above, i.e., the steps of:

(A1) producing a first metal-based film having an average thickness of 50 nm or smaller on a substrate (hereafter also referred to as a first metal-based film formation step); and (B1) applying a heat treatment to morphologically change the first metal-based film into a first metal-based particle assembly (hereafter also referred to as a first metal-based particle assembly formation step), and for the second time, it includes the steps of:

(A2) producing a second metal-based film on the first metal-based particle assembly (hereafter also referred to as a second metal-based film formation step); and (B2) applying a heat treatment to obtain from the first metal-based particle assembly and the second metal-based film a second metal-based particle assembly formed of a plurality of second metal-based particles mutually separated and disposed in two dimensions (hereafter also referred to as a second metal-based particle assembly formation step).

In other words, step (B2) allows the first metal-based particle assembly that is obtained in step (B1) and the second metal-based film deposited thereon to be integrated together through a heat treatment and thus changed morphologically into the second metal-based particle assembly.

In step (A2), a metal-based film is produced under a condition as described above for metal-based film formation step (A), and in step (B2), a heat treatment is performed under a condition as described above for metal-based particle assembly formation step (B). Steps (A1) and (A2) may be performed under the same conditions or different conditions to produce metal-based films, and steps (B1) and (B2) may provide heat treatments under the same conditions or different conditions.

Preferably, step (A2) provides the second metal-based film to have an average thickness of 50 nm or smaller for a ground similar to the above. The second metal-based film's average thickness, as referred to herein, is an average thickness, as defined above, of a metal-based film, that is obtained when it is produced on a flat substrate under the same conditions as when it is produced on the first metal-based particle assembly (for example, when a coating liquid is applied, it is applied on the same area, with the same composition, in the same method, and in the same amount).

The metal-based particle assembly thus produced on substrate 100 preferably has metal-based particles insulated from each other, that is, it is non-conductive between adjacent metal-based particles (or the metal-based particle assembly (film) is non-conductive). This is because if some or all metal-based particles can pass and receive electrons therebetween, a reduced plasmon resonance effect is provided. Accordingly, for a similar ground, it is preferable to ensure that the metal-based particles be separated and to have no conductive substance interposed therebetween.

Note that the present production method may include the step of producing an insulating layer on a surface of the metal-based particle assembly, as will more specifically be described hereinafter.

<Metal-Based Particle Assembly>

As has been discussed above, the present production method can be employed to produce a satisfactorily controlled metal-based particle assembly having a desired shape (or having metal-based particles with a desired shape, a desired interparticle distance, and the like). Accordingly, the present invention is useful as a method for producing a metal-based particle assembly having unique characteristics, such as presenting significantly intense plasmon resonance that cannot be exhibited without precise shape control. The metal-based particle assembly that is a plasmonic material can be suitably applied as an enhancement element for an optical device including a light emitting device, a photoelectric conversion device and the like, and allows a light emitting device therewith and a photoelectric conversion device therewith to be improved in luminous efficiency and conversion efficiency, respectively, significantly more than conventional.

One example of the above described metal-based particle assembly that the present production method can provide suitably as an enhancement element for an optical device is a metal-based particle assembly that comprises 30 or more metal-based particles mutually separated and disposed in two dimensions, the metal-based particles having an average particle diameter in a range of from 200 to 1600 nm, an average height in a range of from 55 to 500 nm, and an aspect ratio, as defined by a ratio of the average particle diameter to the average height, in a range of from 1 to 8, and that has any one of the following features:

[i] The metal-based particle assembly is configured of metal-based particles disposed to have an average distance between adjacent ones thereof (or to have an average interparticle distance) within a range of 1-150 nm (hereinafter also referred to as a metal-based particle assembly [i]);

[ii] The metal-based particle assembly presents in an absorption spectrum for a visible light region a maximum wavelength of a peak at a longest side in wavelength, and the maximum wavelength shifts toward a shorter side in wavelength in a range of from 30 to 500 nm as compared with that of a reference metal-based particle assembly (X) in which metal-based particles having a particle diameter equal to the above average particle diameter and a height equal to the above average height and being identical in material to those of the former metal-based particle assembly are disposed such that each distance between adjacent metal-based particles may be in a range of from 1 to 2 μm (hereinafter also referred to as a metal-based particle assembly [ii]); and

[iii] the metal-based particle assembly has in an absorption spectrum for a visible light region a maximum wavelength of a peak at a longest side in wavelength, and an absorbance at the maximum wavelength is higher as compared with that of a reference metal-based particle assembly (Y) in which metal-based particles having a particle diameter equal to the above average particle diameter and a height equal to the above average height and being identical in material to those of the former metal-based particle assembly are disposed such that each distance between adjacent metal-based particles may be in a range of from 1 to 2 μm, on the premise that the numbers of the metal-based particles are the same (hereinafter also referred to as a metal-based particle assembly [iii]).

When the present metal-based particle assembly is compared with a reference metal-based particle assembly, having an average particle diameter and an average height equal to those of reference metal-based particle assembly (X) or (Y) means that the average particle diameters have a difference within a range of ±45 nm and the average heights have a difference within a range of ±15 nm.

Using a conventional plasmonic material (or metal nanoparticles or their assembly) to exploit its localized plasmon resonance for example for emission enhancement is accompanied by such an issue that localized plasmon resonance has an effect in an extremely limited range of 10 nm or smaller from a surface of the metal nanoparticle. This is because a metal nanoparticle and a molecule to be excited with a larger distance therebetween result in ineffective localized plasmon resonance and hence a gradually reduced emission enhancement effect, and the metal nanoparticle and the molecule to be excited with a distance therebetween exceeding the range allowing the Förster mechanism to present energy transfer (i.e., 1 nm to 10 nm) fail to provide a substantial emission enhancement effect. PTDs 1-3 also describe emission enhancement methods such that a metal nanoparticle and a molecule to be excited effectively have a distance of 10 nm or smaller therebetween to obtain an effective emission enhancement effect.

Utilizing localized plasmon resonance of conventional metal nanoparticles or their assembly thus does not sufficiently satisfactorily effectively enhance an optical device as the localized plasmon resonance has an effect in only a limited range. More specifically, when an optical device has an active layer (e.g., a light emitting layer for a light emitting device, a light-absorbing layer for a photoelectric conversion device, and the like) having the thickness of several tens nm or larger, disposing the metal nanoparticle adjacent to or in the active layer only allows localized plasmon resonance to present a direct enhancement effect at a limited portion of the active layer, and thus only partially effectively improves luminous efficiency and conversion efficiency.

In contrast, the present production method can provide metal-based particle assemblies [i] to [iii] that are configured of metal-based particles that on one hand have a relatively large particle diameter considered in general to contribute to a small emission enhancement effect (see PTD 1, paragraphs 0010 and 0011) while on the other hand having a specific shape and the like that allow significantly intense plasmon resonance to be presented and the plasmon resonance to have an effect over a significantly extended range (or a plasmonic enhancement effect covering the range).

Hereinafter metal-based particle assemblies [i] to [iii] will more specifically be described.

(Metal-Based Particle Assembly [i])

Metal-based particle assembly [i] is significantly advantageous as follows:

(1) Metal-based particle assembly [i] presents significantly intense plasmon resonance and when it is applied to a light emitting device, it can provide a larger emission enhancement effect than a conventional plasmonic material, and hence drastically increased luminous efficiency. Furthermore, when it is applied to a photoelectric conversion device, the former can drastically enhance the latter in conversion efficiency. Metal-based particle assembly [i] presents plasmon resonance having an intensity that is not a simple sum total of localized plasmon resonances that individual metal-based particles exhibit for a specific wavelength; rather, it can present an intensity larger than that. More specifically, 30 or more metal-based particles each having a prescribed shape, that are spaced as prescribed, as described above, to be closely disposed, can have the individual metal-based particles interacting with each other to present significantly intense plasmon resonance. This is believed to be exhibited as the metal-based particles' localized plasmons interact with each other.

Generally, when a plasmonic material is subjected to absorption spectrum measurement through absorptiometry, a peak in an ultraviolet to visible light region is observed as a plasmon peak, and this plasmon peak's absorbance value in magnitude at a maximum wavelength thereof can be used to easily evaluate the plasmonic material's plasmon resonance in intensity, and when metal-based particle assembly [i] is subjected on a glass substrate to absorption spectrum measurement, it can present for a visible light region a maximum wavelength of a plasmon peak at a longest side in wavelength, and an absorbance at the maximum wavelength can be 0.4 or larger, further 0.7 or larger, and still further 0.9 or larger.

The metal-based particle assembly's absorption spectrum is measured through absorptiometry such that the metal-based particle assembly provided on a glass substrate serves as a sample to be measured. More specifically, the absorption spectrum is obtained as follows: the glass substrate having the metal-based particle assembly deposited thereon is exposed to light of the ultraviolet to visible light region incident on a back surface thereof (i.e., a side facing away from the metal-based particle assembly) in a direction perpendicular to the back surface and intensity I of transmitted light omnidirectionally transmitted toward the metal-based particle assembly is measured with an integrating sphere spectrophotometer. On the other hand, a substrate which is equal in thickness to and identical in material to the glass substance of the sample to be measured and does not have the metal-based particle assembly deposited thereon is exposed at a surface thereof to the same incident light as above in a direction perpendicular to that surface and intensity $I_0$ of transmitted light omnidirectionally transmitted through a side opposite to the incident surface is measured with the integrating sphere spectrophotometer. The absorption spectrum is represented with an axis of ordinates representing absorbance, which is expressed by the following expression:

Absorbance=$-\log_{10}(I/I_0)$.

(2) Plasmon resonance has an effect over a significantly extended range (or a plasmonic enhancement effect covering the range). Such an effective extension is also believed to be manifested as 30 or more metal-based particles having a prescribed shape and spaced as prescribed to be closely disposed present localized plasmons interacting with each other. Conventionally, plasmon resonance has an effect over a range that is generally limited to that of the Førster distance (i.e., approximately 10 nm or smaller), whereas metal-based particle assembly [i] allows the range to be extended for example to approximately several hundreds nm.

Plasmon resonance having an effect over such an extended range as above is significantly advantageous in enhancing optical devices such as light emitting devices, photoelectric conversion devices and the like. The plasmon resonance having an effect over the significantly extended range allows an active layer having the thickness of several tens nm or larger to be also entirely enhanced, thereby significantly improving the optical device's enhancement effect (such as luminous efficiency, conversion efficiency and/or the like).

Furthermore, while a conventional plasmonic material needs to be disposed to have a distance to an active layer within the range of the Förster distance, metal-based particle assembly [i] can achieve effective enhancement via plasmon resonance with a plasmonic material disposed at a position for example 10 nm, further several tens nm (e.g., 20 nm), still further several hundreds nm away from the active layer. This means that, for example for a light emitting device, the metal-based particle assembly can be disposed in a vicinity of a light extraction face considerably remote from a light emitting layer, and this can reduce the light emitted from the metal-based particle assembly that is totally reflected at an interface of the light emitting device's various constituent layers that the light passes through before it reaches the light extraction face, and significantly improved light extraction efficiency can thus be achieved.

Thus while metal-based particle assembly [i] employs metal-based particles of a relatively large size that would each alone be less prone to generate dipole-type localized plasmon for a visible light region, metal-based particle assembly [i] has at least a specific number of such large-size particles, which are each required to have a prescribed shape though, spaced as prescribed to be closely disposed so that a significantly large number of surface free electrons that the large-size metal-based particles include therein can be effectively excited as plasmon to achieve significantly intense plasmon resonance and allow the plasmon resonance to have an effect over a significantly extended range.

Furthermore, metal-based particle assembly [i] that is structured such that at least a specific number of metal-based particles of a relatively large size having a specific shape are disposed in two dimensions with a specific spacing therebetween, accordingly has an advantageous effect as follows:

(3) A plasmon peak's maximum wavelength can present a unique shift in an absorption spectrum for a visible light region, depending on the metal-based particles' average particle diameter and average interparticle distance. More specifically, when the metal-based particles have a fixed average interparticle distance while having increased average particle diameters, a plasmon peak at a longest side in wavelength for the visible light region has a maximum wavelength shifting toward a shorter side in wavelength (or blue-shifted). Similarly, when the large-size metal-based particles have a fixed average particle diameter while having decreased average interparticle distances (i.e., when the particles are disposed more closely), a plasmon peak at a longest side in wavelength for the visible light region has a maximum wavelength shifting toward a shorter side in wavelength. This unique phenomenon is contradictory to the Mie-scattering theory generally accepted regarding plasmonic materials (according to this theory, larger particle diameters result in a plasmon peak having a maximum wavelength shifting toward a longer side in wavelength (or red-shifted)).

Such a unique blue shift as described above is also believed to result as metal-based particle assembly [i] is structured with relatively large-size metal-based particles closely disposed with a specific spacing therebetween and accordingly, the metal-based particles' localized plasmons interact with each other. Metal-based particle assembly [i] (when it is layered on a glass substrate) can present in an absorption spectrum for a visible light region, as measured through absorptiometry, a maximum wavelength of a plasmon peak at a longest side in wavelength, and the maximum wavelength can be in a range of for example from 350 to 550 nm, depending on the metal-based particles' shape, average interparticle distance and the like. Furthermore, metal-based particle assembly [i] can typically cause a blue shift of approximately 30-500 nm (e.g., 30-250 nm) as compared with a metal-based particle assembly having metal-based particles with a sufficiently large interparticle distance (for example of 1 μm).

The metal-based particle assembly with a plasmon peak having a maximum wavelength blue-shifted as compared with a conventional metal-based particle assembly is significantly advantageous as follows. More specifically, while there is a strong demand for a blue luminescent material (or a luminescent material of a wavelength range close thereto; the same applies hereinafter), in particular a blue phosphorescent material, presenting high luminous efficiency, currently it is difficult to develop such a material with sufficiently practical usability. Applying metal-based particle assembly [i] that has a plasmon peak for example in the blue wavelength range to a light emitting device as an enhancement element allows the light emitting device to have its luminous efficiency enhanced to a sufficient extent even when the light emitting device uses a blue luminescent material of relatively low luminous efficiency. Furthermore, when it is applied to a photoelectric conversion device (e.g., a solar cell device or the like), it for example allows a resonant wavelength to be blue-shifted so that a wavelength range that has not been utilized by the active layer per se can effectively be utilized to provide more efficient conversion.

Hereinafter metal-based particle assembly [i] will more specifically be described in configuration in detail.

The metal-based particles have an average particle diameter within a range of 200-1600 nm, and to effectively obtain effects (1) to (3) it falls within a range preferably of 200-1200 nm, more preferably 250-500 nm, still more preferably 300-500 nm. Preferably, the metal-based particles' average particle diameter is selected, as appropriate, depending on what type of optical device the metal-based particle assembly is applied to as an enhancement element, what type of material configures the metal-based particles, and the like.

It should be noted here that a metal-based particle of a large size having an average particle diameter for example of 500 nm is alone not observed to present a substantial enhancement effect via localized plasmon, as has been discussed previously. In contrast, metal-based particle assembly [i] has at least a prescribed number (30) of such large-size metal-based particles spaced as prescribed to be closely disposed to provide significantly intense plasmon resonance and allow the plasmon resonance to have an effect over a significantly extended range, and furthermore, to achieve effect (3).

The average particle diameter of the metal-based particle, as referred to herein, is obtained as follows: the metal-based particle assembly having metal-based particles disposed in two dimensions is observed with an SEM from directly above to obtain an SEM image thereof, and therein ten particles are selected at random and in each particle's image five tangential diametrical lines are drawn at random (note that the straight lines serving as the tangential diametrical lines can pass through only inside the image of the particle and one of the lines is a straight line passing through only inside the particle and drawable to be the longest) and their average value serves as the particle's diameter and the 10 selected particles' respective such particle diameters are averaged to obtain the average particle diameter of the metal-based particle. The tangential diametrical line is defined as a perpendicular line connecting a spacing between two parallel lines sandwiching the particle's contour (in a projected image) in contact therewith (see the Nikkan Kogyo Shimbun, Ltd., "Particle Measurement Technique", 1994, page 5).

The metal-based particle has an average height within a range of 55-500 nm, and to effectively obtain effects (1) to (3) it falls within a range preferably of 55-300 nm, more preferably 70-150 nm. The average height of the metal-based particles is obtained as follows: the metal-based particle assembly is observed with an AFM to obtain an AFM image thereof and therein 10 particles are selected at random and measured in height and their measurements are averaged to obtain the average height.

The metal-based particle has an aspect ratio in a range of 1-8, and preferably, the aspect ratio is selected, as appropriate, within that range, depending on what type of optical device the metal-based particle assembly is applied to as an enhancement element. For example, when the metal-based particle assembly is applied as an enhancement element for a light emitting device, there is a tendency that oblate metal-based particles are preferable, and in that case, to obtain a higher enhancement effect, an aspect ratio of 2-8 is preferable, and an aspect ratio of 2.5-8 is more preferable. In contrast, when the metal-based particle assembly is applied as an enhancement element for a photoelectric conversion device, then, to obtain a higher enhancement effect, there is a tendency that a metal-based particle having a shape closer to a sphere is preferable. The aspect ratio of the metal-based particle is defined as a ratio of the above average particle diameter to the above average height (i.e., average particle diameter/average height).

While the metal-based particle preferably has a smoothly curved surface in view of exciting significantly effective plasmon, the metal-based particle may have a surface with small recesses and projections (or roughness) to some extent and in that sense the metal-based particle may be indefinite in shape.

Preferably, the metal-based particles have variation therebetween in size as minimally as possible in view of uniformity in intensity of plasmon resonance within a plane of the metal-based particle assembly. Even if there is a small variation in particle diameter, it is not preferable that large-size particles have an increased distance therebetween and it is preferable that particles of small size be introduced between the large-size particles to help the large-size particles to exhibit their interaction.

Metal-based particle assembly [i] has metal-based particles disposed such that immediately adjacent ones thereof have an average distance therebetween (or an average interparticle distance) within a range of 1-150 nm. The metal-based particles thus closely disposed allow significantly intense plasmon resonance to be presented and the plasmon resonance to have an effect over a significantly extended range, and furthermore, can achieve effect (3). To effectively obtain effects (1) to (3), the average interparticle distance is within a range preferably of 1-100 nm, more preferably 1-50 nm, still more preferably 1-20 nm. An average interparticle distance smaller than 1 nm results in the particles transferring electrons therebetween through the Dexter mechanism, which disadvantageously deactivates localized plasmon.

The average interparticle distance, as referred to herein, is obtained as follows. A metal-based particle assembly having metal-based particles disposed in two dimensions is observed with an SEM from directly above to obtain an SEM image thereof, and therein 30 particles are selected at random and for each selected particle an interparticle distance to an immediately adjacent particle is obtained and the 30 particles' such interparticle distances are averaged to obtain an average interparticle distance. In obtaining an interparticle distance to an immediately adjacent particle, a distance to any immediately adjacent particle, as obtained between a surface of the particle of interest and that of the immediately adjacent particle, is measured, and such measurements are averaged to obtain the interparticle distance.

Metal-based particle assembly [i] includes 30 or more metal-based particles, preferably 50 or more metal-based particles. 30 or more metal-based particles assembled together present their localized plasmons interacting with each other effectively and thus present significantly intense plasmon resonance and its effect over an extended range.

When metal-based particle assembly [i] is applied to an optical device as an enhancement element, then, in light of the optical device's typical device area, metal-based particle assembly [i] can include 300 or more metal-based particles, and furthermore, 17500 or more metal-based particles, for example.

Metal-based particle assembly [i] includes metal-based particles having a number density preferably of 7 particles/$\mu m^2$ or larger, more preferably 15 particles/$\mu m^2$ or larger.

Furthermore, as has been set forth above, metal-based particle assembly [i] preferably has metal-based particles insulated from each other, that is, preferably, it is non-conductive between adjacent metal-based particles (or the metal-based particle assembly (film) is non-conductive).

(Metal-Based Particle Assembly [ii])

Metal-based particle assembly [ii] is significantly advantageous as follows:

(I) Metal-based particle assembly [ii] presents in an absorption spectrum for a visible light region a maximum wavelength of a plasmon peak at a longest side in wavelength, and the maximum wavelength is present in a specific wavelength range. Specifically, when metal-based particle assembly [ii] is subjected to absorption spectrum measurement, it presents a plasmon peak with a maximum wavelength shifted to a shorter side in wavelength (or blue-shifted) in a range of 30-500 nm (e.g., 30-250 nm) as compared with a maximum wavelength of reference metal-based particle assembly (X) described later, and typically the plasmon peak has the maximum wavelength within a range of 350-550 nm.

Metal-based particle assembly [ii] that can have a plasmon peak in a blue wavelength range or a neighboring wavelength range as described above is significantly useful for a light emitting device that employs a luminescent material of the blue or neighboring wavelength range to provide enhanced emission or the like, and a light emitting device including metal-based particle assembly [ii] can achieve sufficiently enhanced luminous efficiency even when the light emitting device includes a blue luminescent material of relatively low luminous efficiency. Furthermore, when metal-based particle assembly [ii] is applied to a photoelectric conversion device (e.g., a solar cell device or the like), it for example allows a resonant wavelength to be blue-shifted so that a wavelength range that has not been utilized by an active layer per se can effectively be utilized to provide more efficient conversion.

It is believed that the blue shift as described above results as metal-based particle assembly [ii] is structured with at least a specific number of large-size metal-based particles having a specific shape spaced in two dimensions and accordingly, the metal-based particles' localized plasmons interact with each other.

When a metal-based particle assembly and reference metal-based particle assembly (X) are observed to compare the maximum wavelengths of their peaks at a longest side in wavelength and the absorbances at the maximum wavelengths, a microscope ("OPTIPHOT-88" produced by Nikon) and a spectrophotometer ("MCPD-3000" produced by Otsuka Electronics Co., Ltd.) are used to perform absorption spectrum measurement in a narrowed field of view.

Reference metal-based particle assembly (X) is a metal-based particle assembly in which metal-based particles A that have a particle diameter and a height equal to the average particle diameter and average height of a metal-based particle assembly subject to absorption spectrum measurement and are identical in material to the metal-based particles of that metal-based particle assembly are disposed such that each distance between adjacent metal-based particles may be in a range of from 1 to 2 μm, and reference metal-based particle assembly (X) has a size allowing reference metal-based particle assembly (X) layered on a glass substrate to undergo absorption spectrum measurement via a microscope, as described above.

The wave pattern of the absorption spectrum of reference metal-based particle assembly (X) is also theoretically calculatable in the 3D-FDTD method using the particle diameter and height of metal-based particle A, the dielectric function of a material of metal-based particle A, the dielectric function of a medium (e.g., air) surrounding metal-based particle A, and the dielectric function of the substrate (e.g., a glass substrate).

Furthermore, metal-based particle assembly [ii] that is structured with at least a specific number of metal-based particles of a relatively large size having a specific shape separated in two dimensions, can, as a result, (II) present significantly intense plasmon resonance as well as effect (1) of metal-based particle assembly [i], (III) allows the plasmon resonance to have an effect over a significantly extended range (or a plasmonic enhancement effect covering the range) as well as effect (2) of metal-based particle assembly [i], and the like. When metal-based particle assembly [ii] layered on a glass substrate is subjected to absorption spectrum measurement, it can present for the visible light region a maximum wavelength of a plasmon peak at a longest side in wavelength, and an absorbance at the maximum wavelength can be 0.4 or larger, further 0.7 or larger, and still further 0.9 or larger.

Metal-based particle assembly [ii] can have a specific configuration (for its metal-based particles' material, average particle diameter, average height, aspect ratio and average interparticle distance, the number of the metal-based particles, the metal-based particle assembly's non-conductance, and the like) basically similar to that of metal-based particle assembly [i]. Metal-based particle assembly [ii] also has its metal-based particles with their average particle diameter, average height, aspect ratio, and average interparticle distance defined to be identical to those of the metal-based particles of metal-based particle assembly [i].

The metal-based particles have an average particle diameter within a range of 200-1600 nm, and to effectively obtain effects (I) to (III) it falls within a range preferably of 200-1200 nm, more preferably 250-500 nm, still more preferably 300-500 nm. At least a prescribed number (30) of such large-size metal-based particles disposed in two dimensions and thus assembled together allow significantly intense plasmon resonance and its effect over a significantly extended range. Furthermore, to also present feature [ii] (i.e., a plasmon peak shifted to a shorter side in wavelength), it is essential that the metal-based particles have an average particle diameter of 200 nm or larger, preferably 250 nm or larger. Preferably, the metal-based particles' average particle diameter is selected, as appropriate, depending on what type of optical device the metal-based particle assembly is applied to as an enhancement element, what type of material configures the metal-based particles, and the like.

Metal-based particle assembly [ii] presents for a visible light region a maximum wavelength of a plasmon peak at a longest side in wavelength, and the maximum wavelength depends on the metal-based particles' average particle diameter. More specifically, when the metal-based particles have an average particle diameter exceeding a certain value, the plasmon peak has the maximum wavelength shifting toward a shorter side in wavelength (or blue-shifted).

The metal-based particles have an average height within a range of 55-500 nm, and to effectively obtain effects (I) to (III) it falls within a range preferably of 55-300 nm, more preferably 70-150 nm. The metal-based particle has an aspect ratio in a range of 1-8, and, as has been discussed for metal-based particle assembly [i], preferably the aspect ratio is selected, as appropriate, within that range, depending on what type of optical device the metal-based particle assembly is applied to as an enhancement element.

Preferably, metal-based particle assembly [ii] has metal-based particles disposed to have an average interparticle distance within a range of 1-150 nm. More preferably, it is within a range of 1-100 nm, still more preferably 1-50 nm, particularly more preferably 1-20 nm. Such closely disposed metal-based particles present their localized plasmons interacting with each other effectively and thus facilitate presenting effects (I) to (III). As a plasmon peak's maximum wavelength depends on the metal-based particles' average interparticle distance, the average interparticle distance can be adjusted to control to what extent a plasmon peak at a longest side in wavelength should be blue-shifted, the plasmon peak's maximum wavelength, and the like. An average interparticle distance smaller than 1 nm results in the particles transferring electrons therebetween through the Dexter mechanism, which disadvantageously deactivates localized plasmon.

Metal-based particle assembly [ii] includes 30 or more metal-based particles, preferably 50 or more metal-based particles. 30 or more metal-based particles assembled together can have their localized plasmons interacting with each other effectively and thus allow feature [ii] and effects (I) to (III) to be presented.

When metal-based particle assembly [ii] is applied to an optical device as an enhancement element, then, in light of the optical device's typical device area, metal-based particle assembly [ii] can include 300 or more metal-based particles, and furthermore, 17500 or more metal-based particles, for example. Metal-based particle assembly [ii] includes metal-based particles having a number density preferably of 7 particles/$\mu m^2$ or larger, more preferably 15 particles/$\mu m^2$ or larger.

(Metal-Based Particle Assembly [iii])

Metal-based particle assembly [iii] is significantly advantageous as follows:

(a) Metal-based particle assembly [iii] shows for a visible light region a maximum wavelength of a peak at a longest side in wavelength, or a plasmon peak, and an absorbance at the maximum wavelength is higher as compared with that of reference metal-based particle assembly (Y), which will be described later, that can be regarded as an assembly of metal-based particles simply assembled together without any interparticle interaction, and accordingly, metal-based particle assembly [iii] presents significantly intense plasmon resonance, and when it is applied to a light emitting device, it can provide a larger emission enhancement effect than a conventional plasmonic material, and hence drastically increased luminous efficiency. Furthermore, when it is applied to a photoelectric conversion device, the former can drastically enhance the latter in conversion efficiency. It is believed that such an intense plasmon resonance is exhibited as the metal-based particles' localized plasmons interact with each other.

As has been described above, a plasmonic material's plasmon resonance can be easily evaluated in intensity from a plasmon peak's absorbance value in magnitude at a maximum wavelength thereof, and when metal-based particle assembly [iii] provided on a glass substrate is subjected to absorption spectrum measurement, it can present for a visible light region a maximum wavelength of a plasmon peak at a longest side in wavelength, and an absorbance at the maximum wavelength can be 0.4 or larger, further 0.7 or larger, and still further 0.9 or larger.

As has been described above, when a metal-based particle assembly and reference metal-based particle assembly (Y) are observed to compare the maximum wavelengths of their peaks at a longest side in wavelength and the absorbances at the maximum wavelengths, a microscope ("OPTIPHOT-88" produced by Nikon) and a spectrophotometer ("MCPD-3000" produced by Otsuka Electronics Co., Ltd.) are used to perform absorption spectrum measurement in a narrowed field of view.

Reference metal-based particle assembly (Y) is a metal-based particle assembly in which metal-based particles B that have a particle diameter and a height equal to the average particle diameter and average height of a metal-based particle assembly subject to absorption spectrum measurement and are identical in material to the metal-based particles of that metal-based particle assembly are disposed such that each distance between adjacent metal-based particles may be in a range of from 1 to 2 $\mu m$, and reference metal-based particle assembly (Y) has a size allowing reference metal-based particle assembly (Y) layered on a glass substrate to undergo absorption spectrum measurement via a microscope, as described above.

When the metal-based particle assembly subject to absorption spectrum measurement and reference metal-based particle assembly (Y) are compared in their absorbances at the maximum wavelengths of their peaks at a longest side in wavelength, an absorption spectrum of reference metal-based particle assembly (Y) as converted to have the same number of metal-based particles is obtained and an absorbance at a maximum wavelength of a peak in that absorption spectrum, which peak is present at a longest side in wavelength, is used as a target for comparison, as will be described hereinafter. Specifically, an absorption spectrum of the metal-based particle assembly and that of reference metal-based particle assembly (Y) are obtained and the absorbances at the maximum wavelengths of the peaks in the absorption spectra, which peaks are present at a longest side in wavelength, respectively, are divided by their respective coverages (i.e., the coverages of their respective substrates' surfaces by the metal-based particles), and the obtained values are compared.

Furthermore, metal-based particle assembly [iii] that is structured with at least a specific number of metal-based particles of a relatively large size having a specific shape separated in two dimensions, can, as a result, (b) present plasmon resonance to have an effect over a significantly extended range (or a plasmonic enhancement effect covering the range) as well as effect (2) of metal-based particle assembly [i], (c) present a plasmon peak having a maximum wavelength uniquely shifted as well as effect (3) of metal-based particle assembly [i], and the like.

Metal-based particle assembly [iii] (when it is layered on a glass substrate) can present in an absorption spectrum for a visible light region, as measured through absorptiometry, a maximum wavelength of a plasmon peak at a longest side in wavelength, and the maximum wavelength can be in a range of for example from 350 to 550 nm, depending on the metal-based particles' shape, average interparticle distance and the like. Furthermore, metal-based particle assembly [iii] can typically cause a blue shift of approximately 30-500 nm (e.g., 30-250 nm) as compared with a metal-based particle assembly having metal-based particles with a sufficiently large interparticle distance (for example of 1 $\mu m$).

Metal-based particle assembly [iii] can have a specific configuration (for its metal-based particles' material, average particle diameter, average height, aspect ratio and average interparticle distance, the number of the metal-based particles, the metal-based particle assembly's non-conductance, and the like) basically similar to that of metal-based particle assembly [i]. Metal-based particle assembly [iii] also has its metal-based particles with their average particle diameter, average height, aspect ratio, and average interparticle distance defined to be identical to those of the metal-based particles of metal-based particle assembly [i].

The metal-based particles have an average particle diameter within a range of 200-1600 nm, and to effectively obtain feature [iii] (i.e., to have an absorbance at a maximum wavelength of a plasmon peak at a longest side in wavelength to be larger than that of reference metal-based particle assembly (Y)), and furthermore, effects (a) to (c), it falls within a range preferably of 200-1200 nm, more preferably 250-500 nm, still more preferably 300-500 nm. Thus it is important to provide relatively large-size metal-based particles, and at least a specific number of (30) such large-size metal-based particles disposed in two dimensions and thus assembled together can achieve significantly intense plasmon resonance and furthermore, allow the plasmon resonance to have an effect over a significantly extended range and a plasmon peak to be shifted to a shorter side in wavelength. Preferably, the metal-based particles' average particle diameter is selected, as appropriate, depending on what type of optical device the metal-based particle assembly is applied to as an enhancement element, what type of material configures the metal-based particles, and the like.

The metal-based particle has an average height within a range of 55-500 nm, and to effectively obtain feature [iii] and furthermore, effects (a) to (c) it falls within a range preferably of 55-300 nm, more preferably 70-150 nm. The metal-based particle has an aspect ratio in a range of 1-8, and, as has been discussed for metal-based particle assembly [i], preferably the aspect ratio is selected, as appropriate, within that range, depending on what type of optical device the metal-based particle assembly is applied to as an enhancement element.

Preferably, metal-based particle assembly [iii] is configured of as uniform metal-based particles as possible in shape (in average particle diameter, average height, and aspect ratio), as such metal-based particles can effectively achieve feature [iii]. More specifically, the uniformly shaped metal-based particles provide a steep plasmon peak, followed by an absorbance of a plasmon peak at a longest side in wavelength being prone to be higher than that of reference metal-based particle assembly (Y). Metal-based particles less varying in shape are also advantageous in view of uniformity in intensity of plasmon resonance within a plane of the metal-based particle assembly. Note, however, that, as has been set forth above, even if there is a small variation in particle diameter, it is not preferable that large-size particles have an increased distance therebetween and it is preferable that particles of small size be introduced between the large-size particles to help the large-size particles to exhibit their interaction.

Preferably, metal-based particle assembly [iii] has metal-based particles disposed to have an average interparticle distance within a range of 1-150 nm. More preferably, it is within a range of 1-100 nm, still more preferably 1-50 nm, particularly more preferably 1-20 nm. Such closely disposed metal-based particles present their localized plasmons interacting with each other effectively and thus allow feature [iii], and furthermore, effects (a) to (c) to be effectively presented. An average interparticle distance smaller than 1 nm results in the particles transferring electrons therebetween through the Dexter mechanism, which disadvantageously deactivates localized plasmon.

Metal-based particle assembly [iii] includes 30 or more metal-based particles, preferably 50 or more metal-based particles. 30 or more metal-based particles assembled together can have their localized plasmons interacting with each other effectively and thus allow feature [iii], and furthermore, effects (a) to (c) to be effectively presented.

When metal-based particle assembly [iii] is applied to an optical device as an enhancement element, then, in light of the optical device's typical device area, metal-based particle assembly [iii] can include 300 or more metal-based particles, and furthermore, 17500 or more metal-based particles, for example. Metal-based particle assembly [iii] includes metal-based particles having a number density preferably of 7 particles/$\mu m^2$ or larger, more preferably 15 particles/$\mu m^2$ or larger.

Thus, metal-based particle assembly [iii] can be obtained by controlling its constituent metal-based particles in metal type, shape, interparticle distance, and the like.

The metal-based particle assembly that the present production method can provide suitably as an enhancement element for an optical device more preferably has any two or more of features [i] to [iii], still more preferably all thereof.

As has been described above, the present production method may include metal-based particle assembly formation step (B) followed by an insulating layer formation step to provide an insulating layer on a thin film of the metal-based particle assembly to cover a surface of each metal-based particle. Such an insulating layer is preferable not only in ensuring that the metal-based particle assembly is non-conductive (between the metal-based particles), as described above, but also in applying the metal-based particle assembly to an optical device. More specifically, while an optical device such as an electrical energy-driven light emitting device, photoelectric conversion device, or the like has each constituent layer with a current passing therethrough, the metal-based particle assembly with a current passing therethrough may result in failing to provide a sufficient enhancement effect via plasmon resonance. When the metal-based particle assembly that is capped by the insulating layer is applied to the optical device, the optical device can have the metal-based particle assembly electrically insulated from an adjacent constituent layer of the optical device and thus have the metal-based particle assembly without a current injected into the metal-based particles that compose the metal-based particle assembly.

The insulating layer is made of any material that is not specially restricted as long as having satisfactory insulation, and it can be made for example of spin on glass (SOG; containing organic siloxane material for example) and in addition thereto $SiO_2$, $Si_3N_4$ or the like. While the insulating layer is of any thickness that is not restricted as long as ensuring desired insulation, it is better that the insulating layer is smaller in thickness in a range ensuring desired insulation as it is preferable that an active layer when applied to an optical device (e.g., a light emitting layer for a light emitting device, a light-absorbing layer for a photoelectric conversion device, or the like) and the metal-based particle assembly be closer in distance, as will be described later.

The metal-based particle assembly obtained by the present production method can be incorporated into a variety of optical devices such that the metal-based particle assembly is integrated with a substrate that is used when the metal-based particle assembly is produced.

As has been described above, metal-based particle assemblies [i] to [iii] that can be obtained in the present production method present a significantly intense plasmon resonance and furthermore, allow the plasmon resonance to have an effect over a significantly extended range (or a plasmonic enhancement effect covering the range), and thus allow an active layer having a thickness for example of 10 nm or larger, furthermore, 20 nm or larger, and still furthermore, larger than that to be entirely enhanced. Furthermore, they also allow an active layer disposed at a position for example 10 nm, further several tens nm (e.g., 20 nm), still further several hundreds nm or larger away to be also significantly effectively enhanced.

Note that there is a tendency that, for its nature, the plasmonic enhancement effect decreases as the distance between the active layer and the metal-based particle assembly increases, and accordingly, it is preferable that the distance be smaller. The active layer and the metal-based particle assembly have a distance therebetween preferably of 100 nm or smaller, more preferably 20 nm or smaller, and still more preferably 10 nm or smaller.

Preferably the active layer presents an emission wavelength (for example for a light emitting device) or an absorption wavelength (for example for a photoelectric conversion device) with a maximum wavelength matching or close to that of the plasmon peak of the metal-based particle assembly. This allows plasmon resonance to contribute to a more effectively increased enhancement effect. The maximum wavelength of the plasmon peak of the metal-based particle assembly is controllable by adjusting the assembly's constituent metal-based particles in metal type, average particle diameter, average height, aspect ratio, and/or average interparticle distance.

The above light emitting layer can for example be that formed of 1) monomolecular film including dye molecules disposed in a plane, 2) a matrix doped with dye molecules, 3) a luminescent small molecule, 4) a luminescent polymer, or the like.

Light emitting layer 1) can be obtained by applying a dye molecule-containing liquid with spin-coating and subsequently removing a solvent. The dye molecule specifically includes by way of example rhodamine-based dyes such as rhodamine 101, rhodamine 110, rhodamine 560, rhodamine 6G, rhodamine B, rhodamine 640, and rhodamine 700 sold by Exciton, a coumarin-based dye such as coumarin 503 sold by Exciton, and the like.

Light emitting layer 2) can be obtained by applying a liquid containing dye molecules and a matrix material with spin-coating, and subsequently removing a solvent. The matrix material can be a transparent polymer such as polyvinyl alcohol and polymethyl methacrylate. The dye molecule in a specific example can be similar to that of light emitting layer 1).

Light emitting layer 3) can be obtained through dry or wet deposition including spin-coating, vapor deposition or the like. The luminescent small molecule is specifically exemplified by tris(8-quinolinolato)aluminum complex [tris(8-hydroxyquinoline)aluminum complex; $Alq_3$], bis(benzoquinolinolato)beryllium complex [BeBq], and the like.

Light emitting layer 4) can be obtained by a wet deposition using a luminescent polymer containing liquid such as spin-coating. The luminescent polymer is specifically exemplified by a π-conjugated polymer such as F8BT [poly(9,9-dioctylfluorene-alt-benzothiadiazole)], poly(p-phenylenevinylene), polyalkylthiophene, and the like.

While a metal-based particle assembly that the present production method can provide has mainly been described as metal-based particle assemblies [i] to [iii], it may have any one or more of the number of the metal-based particles that it has, the metal-based particle's shape (in average particle diameter, average height and aspect ratio), and the metal-based particles' average interparticle distance departing from the above indicated ranges. While such a metal-based particle assembly may not be as advantageous as metal-based particle assemblies [i] to [iii] in terms of a plasmonic enhancement effect, it can still present an enhancement effect equivalent to or larger than that of a conventional plasmonic material, and is thus applicable to an enhancement element for an optical device.

Furthermore, the metal-based particle assembly and metal-based particle assembly-layered substrate of the present invention can also be applied for an analysis and a coloring material. The analysis includes surface enhanced Raman spectroscopy utilizing surface enhanced Raman scattering. The coloring material can be used as a material to color a variety of items such as automobiles, pottery, and the like. Furthermore, applying a color filter having the present assembly and/or substrate applied thereto can present a color that is difficult for pigments or dyes to present. The color filter is for example a filter transmitting light of only a specific wavelength, cutting off light of a specific wavelength, and/or the like.

EXAMPLES

Hereinafter, examples will be described to more specifically describe the present invention, although the present invention is not limited thereto. Note that an average thickness of a metal-based film (or silver film) before a heat treatment is performed is calculated as follows: tweezers are used to exfoliate an external surface of the metal-based film in a line to provide a flaw thereto to reach a substrate bearing the metal-based film thereon, and in that line, an AFM image including a cross section of the metal-based film and an interface of the metal-based film and the substrate is obtained and used to obtain a distance from a surface of the substrate that is adjacent to the metal-based film to the external surface of the metal-based film randomly at 10 points and the distances obtained at the 10 points are averaged to obtain the average thickness.

Inventive Example 1

(1) Producing Metal-Based Particle Assembly

An aqueous silver nanoparticle dispersion (produced by Mitsubishi Paper Mills, Ltd., silver nanoparticle concentration: 25% by weight; and silver nanoparticle's average particle diameter: 15 nm) was diluted with pure water to have a silver nanoparticle concentration of 2% by weight. Then to the diluted aqueous silver nanoparticle dispersion 1% by volume of a surfactant was added and sufficiently agitated and thereafter to the obtained aqueous silver nanoparticle dispersion 80% by volume of acetone was added and sufficiently agitated at ordinary temperature to prepare a coating liquid.

Then, the coating liquid was applied with spin-coating at 1000 rpm on a 1 mm thick soda glass substrate having a surface wiped with acetone and thereafter the substrate was left as it was in the air for 1 minute. The obtained silver film had an average thickness of 21.6 nm. Subsequently, the soda glass substrate having the silver film was introduced into an electric furnace of 550° C. and underwent a heat treatment (or was annealed) therein in an atmosphere of air for 40 seconds to obtain a metal-based particle assembly 1-1.

Then, metal-based particle assembly 1-1 obtained was again spin-coated with the coating liquid at 1000 rpm and thereafter it was left as it was in the air for 1 minute. Subsequently, the soda glass substrate having the silver film and metal-based particle assembly 1-1 was introduced into an electric furnace of 550° C. and underwent a heat treatment (or was annealed) therein in an atmosphere of air for 40 seconds to obtain a metal-based particle assembly 1-2.

Then, metal-based particle assembly 1-2 obtained was again spin-coated with the coating liquid at 1000 rpm and thereafter it was left as it was in the air for 1 minute. Subsequently, the soda glass substrate having the silver film and metal-based particle assembly 1-2 was introduced into an electric furnace of 550° C. and underwent a heat treatment (or was annealed) therein in an atmosphere of air for 40 seconds to obtain a metal-based particle assembly 1-3.

Figure 2:
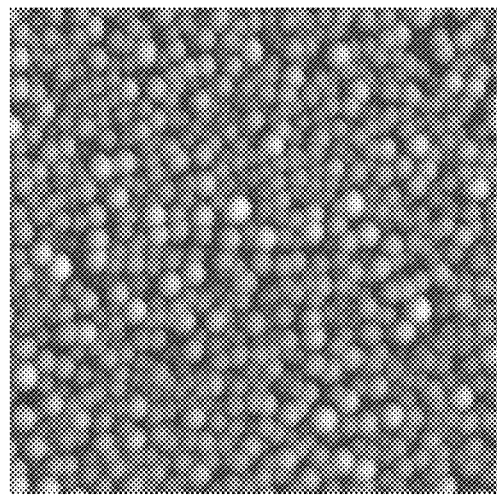
FIG. 2 is an AFM image of a metal-based particle assembly 1-1 obtained in Inventive Example 1.

FIG. 2 is an AFM image of metal-based particle assembly 1-1. The AFM image was obtained via "VN-8010" produced by KEYENCE CORPORATION (this is also applied hereinafter). The AFM image has a size of 5 µm×5 µm (this also applies to the AFM images referred to hereinafter). A calculation with reference to the AFM image indicates that metal-based particle assembly 1-1 was composed of silver particles having an average height of 62.4 nm.

Figure 3A:
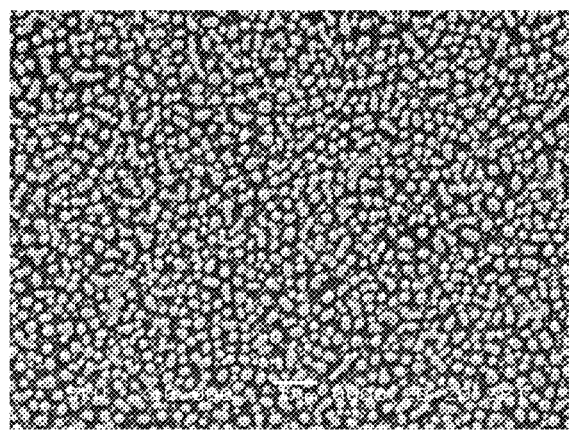
FIGS. 3A and 3B show SEM images (as scaled 10000 times and 50000 times) of a metal-based particle assembly 1-2 obtained in Inventive Example 1, as observed from directly above.
Figure 3B:
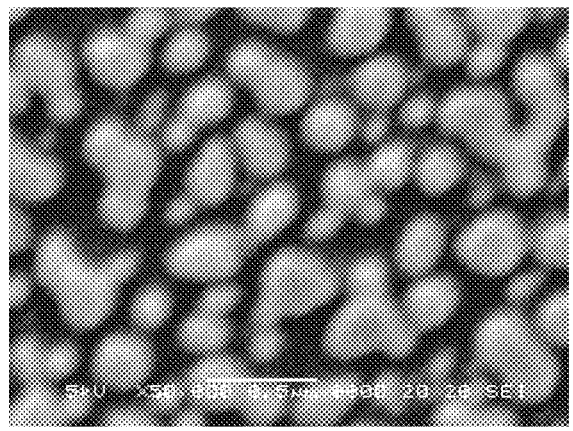
Figure 4:
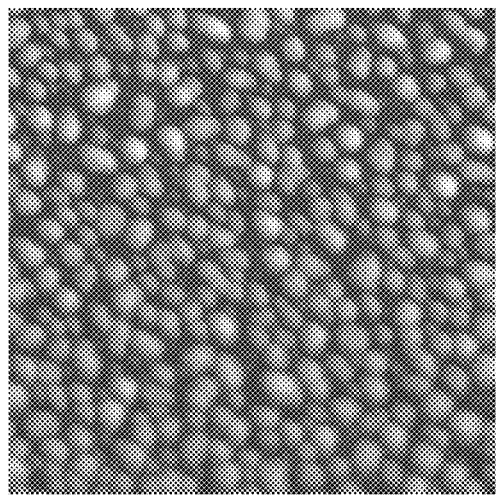
FIG. 4 is an AFM image of metal-based particle assembly 1-2 obtained in Inventive Example 1.

FIGS. 3A and 3B are SEM images of metal-based particle assembly 1-2, as observed from directly above. FIG. 3A shows an image enlarged as scaled 10000 times and FIG. 3B shows an image enlarged as scaled 50000 times. Furthermore, FIG. 4 is an AFM image of metal-based particle assembly 1-2. A calculation with reference to the FIG. 3 SEM images indicates that metal-based particle assembly 1-2 was composed of silver particles having an average particle diameter of 293 nm and an average interparticle distance of 107.8 nm. Furthermore, from the FIG. 4 AFM image, an average height of 93.0 nm was obtained. From these values the silver particle's aspect ratio (average particle diameter/average height) was calculated to be 3.15 and it can also be found from the obtained images that the silver particles have an oblate shape. Furthermore, it can be seen from the SEM images that metal-based particle assembly 1-2 has approximately $3.13 \times 10^{10}$ silver particles (approximately 12.5 particles/µm$^2$).

Figure 5:
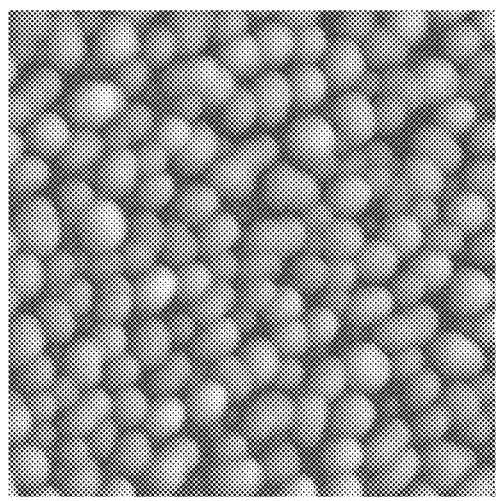
FIG. 5 is an AFM image of a metal-based particle assembly 1-3 obtained in Inventive Example 1.

FIG. 5 is an AFM image of metal-based particle assembly 1-3. A calculation with reference to the AFM image indicates that metal-based particle assembly 1-3 was composed of silver particles having an average height of 140.7 nm.

Furthermore, metal-based particle assemblies 1-1 to 1-3 each had a surface connected to a tester [multimeter "E2378A" produced by Hewlett Packard Co.] to confirm conduction, and they have been found to be non-conductive.

(2) Measuring Absorption Spectrum of Metal-Based Particle Assembly 1-2

Figure 6:
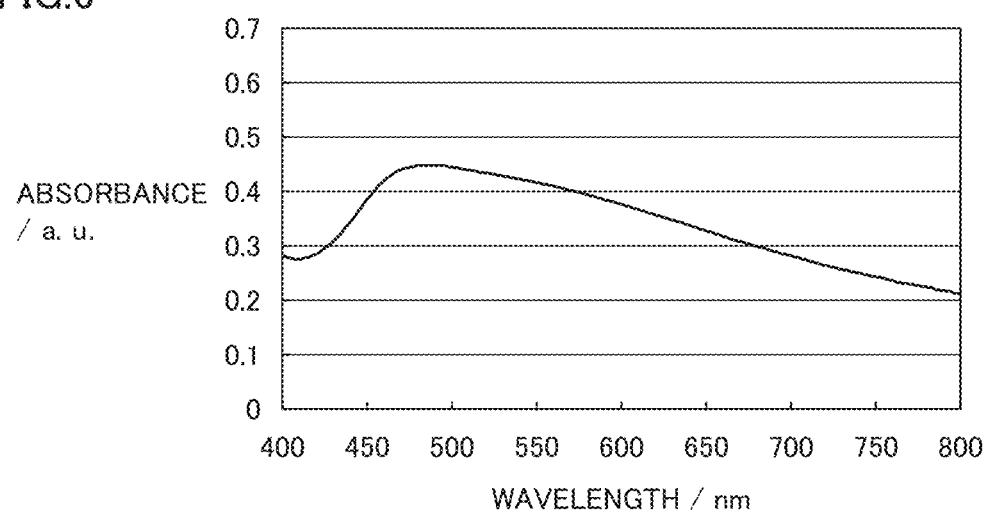
FIG. 6 represents an absorption spectrum of metal-based particle assembly 1-2 obtained in Inventive Example 1.

FIG. 6 represents an absorption spectrum, as measured through absorptiometry, of metal-based particle assembly 1-2 (layered on a substrate). As indicated in a nonpatent document (K. Lance Kelly, et al., "The Optical Properties of Metal Nanoparticles: The Influence of Size, Shape, and Dielectric Environment", The Journal of Physical Chemistry B, 2003, 107, 668), an oblate silver particle singly, rather than assembled together with other oblate silver particles, typically has a plasmon peak around 550 nm and 650 nm for average particle diameters of 200 nm and 300 nm, respectively.

In contrast, it can be seen that metal-based particle assembly 1-2, despite its constituent silver particles having an average particle diameter of approximately 300 nm (293 nm), presents for a visible light region a maximum wavelength of a plasmon peak at a longest side in wavelength, and the maximum wavelength is around approximately 488 nm, or shifted to a shorter side in wavelength, as shown in FIG. 6. It is believed that this phenomenon is manifested because at least a specific number of silver particles have the above prescribed shape and, furthermore, what is preferable is that they are extremely closely disposed. Furthermore, the plasmon peak at a longest side in wavelength for the visible light region presented at the maximum wavelength an absorbance of approximately 0.45, and it can be seen that intense plasmon resonance is presented.

Note that the FIG. 6 absorption spectrum is obtained as follows: a glass substrate having the metal-based particle assembly layered thereon is exposed to light of the ultraviolet to visible light region incident on a back surface thereof (i.e., a side facing away from the metal-based particle assembly) in a direction perpendicular to the back surface and intensity I of transmitted light omnidirectionally transmitted toward the metal-based particle assembly is measured with an integrating sphere spectrophotometer. On the other hand, a substrate which is equal in thickness to and identical in material to the glass substance and does not have the metal-based particle assembly layered thereon is exposed at a surface thereof to the same incident light as above in a direction perpendicular to that surface and intensity $I_0$ of transmitted light omnidirectionally transmitted through a side opposite to the incident surface is measured with the integrating sphere spectrophotometer. The axis of ordinate represents absorbance, which is represented by the following expression:

$$\text{Absorbance} = -\log_{10}(I/I_0).$$

(3) Producing Reference Metal-Based Particle Assembly

FIGS. 7A, 7B, 7C and 7D show a method that was employed to produce a substrate having a reference metal-based particle assembly layered thereon. Initially, resist (ZEP520A produced by Nippon Zeon Co., Ltd.) was applied with spin-coating substantially on an entire surface of a 5 cm long and 5 cm wide soda glass substrate 100 (see FIG. 7A). Resist 400 had the thickness of approximately 120 nm. Then electron beam lithography was employed to provide resist 400 with a circular opening 401 (see FIG. 7B). Circular opening 401 had a diameter of approximately 350 nm. Furthermore, adjacent circular openings 401 had a center-to-center distance of approximately 1500 nm.

Figure 7A:
FIGS. 7A, 7B, 7C and 7D are schematic flow diagrams showing a method for producing a reference metal-based particle assembly.
Figure 7B:
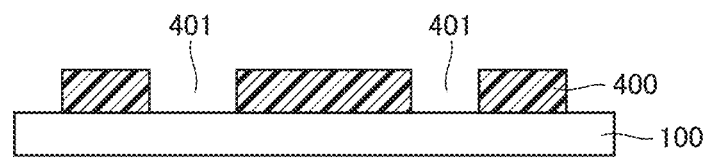
Figure 7C:
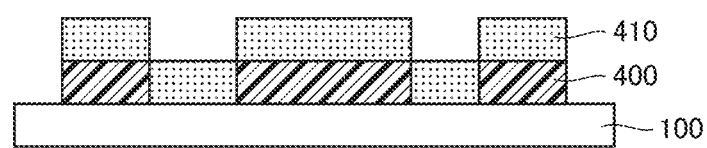
Figure 7D:

Subsequently, resist 400 having circular opening 401 was subjected to vacuum vapor deposition to have a silver film 410 deposited thereon (see FIG. 7C). Silver film 410 had the thickness of approximately 100 nm. Finally, the substrate having silver film 410 was immersed in NMP (N-methyl-2-pyrrolidone produced by Tokyo Chemical Industry Co, Ltd.), and settled in an ultrasonic device for one minute at room temperature to peel off resist 400 and silver film 410 deposited on resist 400, thereby obtaining a reference metal-based particle assembly in which only the silver film 410 (silver particles) in circular opening 401 was left and layered on substrate 100 (see FIG. 7D).

Figure 8B:
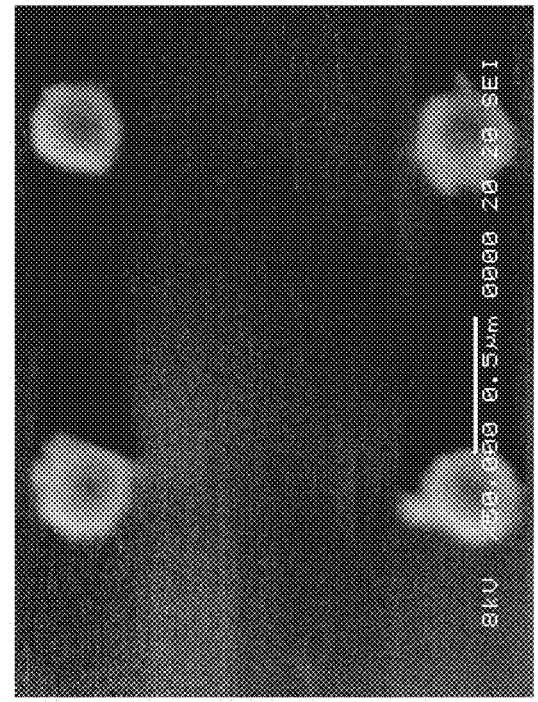
FIGS. 8A and 8B show SEM images (as scaled 20000 times and 50000 times) of a reference metal-based particle assembly, as observed from directly above.
Figure 8A:
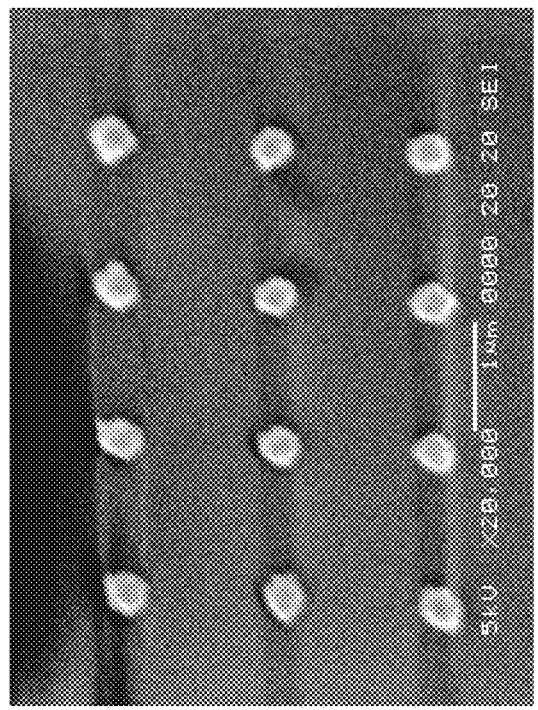

FIGS. 8A and 8B are SEM images of the obtained reference metal-based particle assembly, as observed from directly above. FIG. 8A shows an image enlarged as scaled 20000 times and FIG. 8B shows an image enlarged as scaled 50000 times. A calculation with reference to the FIGS. 8A and 8B SEM images indicates that the reference metal-based particle assembly was configured of silver particles having an average particle diameter of 333 nm and an average interparticle distance of 1264 nm, based on the definitions indicated above. Furthermore, from a separately obtained AFM image, an average height of 105.9 nm was obtained.

Furthermore, from the SEM images, it has been found that the reference metal-based particle assembly had approximately 62500 silver particles.

Figure 9:
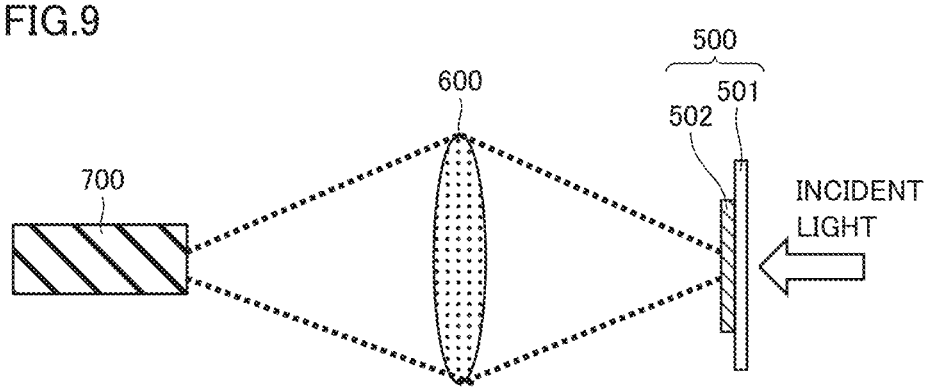
FIG. 9 illustrates an absorption spectrum measurement method using an objective lens (100 times) of a microscope.

(4) Comparing Absorption-Spectra Measured of Metal-Based Particle Assembly 1-2 and Reference Metal-Based Particle Assembly In accordance with the above described measurement method using a microscope's objective lens (100 times), absorption spectrum measurement was performed for metal-based particle assembly 1-2 deposited on a substrate. More specifically, with reference to FIG. 9, a metal-based particle assembly-layered substrate 500 had a substrate 501 exposed at a side thereof (a side facing away from a metal-based particle assembly 502) to light of a visible light region incident thereon in a direction perpendicular to the side. The transmitted light that was transmitted to metal-based particle assembly 502 and reached an objective lens 600 of 100 times was condensed by objective lens 600 and detected via a spectrophotometer 700 to obtain an absorption spectrum. For spectrophotometer 700 was used "MCPD-3000", a spectrophotometer produced by Otsuka Electronics Co., Ltd. for an ultraviolet and visible region, and for objective lens 600 was used "BD Plan 100/0.80 ELWD" produced by Nikon.

As a result, it presented for the visible light region a maximum wavelength of a plasmon peak at a longest side in wavelength, and the maximum wavelength was 516 nm. In contrast, when absorption spectrum measurement was also performed for the reference metal-based particle assembly in accordance with the measurement method using the microscope's objective lens, it presented for the visible light region a maximum wavelength of a peak at a longest side in wavelength, and the maximum wavelength was 654 nm. Metal-based particle assembly 1-2 presents for the visible light region a maximum wavelength of a peak at a longest side in wavelength, and the maximum wavelength is blue-shifted by approximately 170 nm as compared with that of the reference metal-based particle assembly.

In a measurement method using a microscope's objective lens (100 times), as described above, metal-based particle assembly 1-2 presented an absorbance of 0.563 at a maximum wavelength of a peak located in a visible light region at a longest side in wavelength, whereas the reference metal-based particle assembly presented an absorbance of 0.033. Metal-based particle assembly 1-2 and the reference metal-based particle assembly are compared in their absorbances at the maximum wavelengths of their peaks at a longest side in wavelength, as follows: to compare them for the same number of metal-based particles, an absorbance obtained from an absorption spectrum is divided by a parameter corresponding to the number of metal-based particles, i.e., a coverage of a surface of a substrate by the metal-based particles, to obtain absorbance/coverage. Metal-based particle assembly 1-2 had an absorbance/coverage of 1.04 (coverage: 54.2%), whereas the reference metal-based particle assembly had an absorbance/coverage of 0.84 (coverage: 3.9%).

Inventive Examples 2 to 4

(1) Producing Metal-Based Particle Assembly

An aqueous silver nanoparticle dispersion (produced by Mitsubishi Paper Mills, Ltd., silver nanoparticle concentration: 25% by weight; and silver nanoparticle's average particle diameter: 15 nm) was diluted with pure water to have a silver nanoparticle concentration of 2% by weight. Then to the diluted aqueous silver nanoparticle dispersion 1% by volume of a surfactant was added and sufficiently agitated and thereafter to the obtained aqueous silver nanoparticle dispersion 80% by volume of acetone was added and sufficiently agitated at ordinary temperature to prepare a coating liquid.

Then, the coating liquid was applied with spin-coating at 1500 rpm on a 1 mm thick soda glass substrate having a surface wiped with acetone and thereafter the substrate was left as it was in the air for 1 minute. The obtained silver film had an average thickness of 18.0 nm. Subsequently, the soda glass substrate having the silver film was introduced into an electric furnace of 550° C. and underwent a heat treatment (or was annealed) therein in an atmosphere of air for 8 minutes to obtain metal-based particle assembly 2 (as Inventive Example 2).

Furthermore, except that an aqueous silver nanoparticle dispersion (produced by Mitsubishi Paper Mills, Ltd.) was diluted with pure water to have silver nanoparticle concentrations of 4% by weight and 6% by weight, a manner similar to Inventive Example 2 was used to obtain metal-based particle assemblies 3 and 4 (as Inventive Examples 3 and 4, respectively). Inventive Example 3 before the heat treatment had a silver film having an average thickness of 24.3 nm, and Inventive Example 4 before the heat treatment had a silver film having an average thickness of 28.2 nm.

Figure 10:
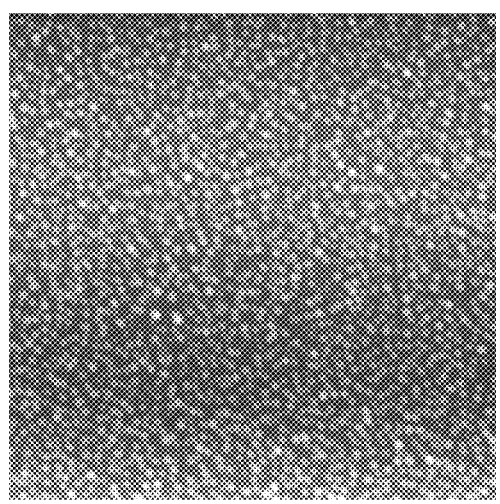
FIG. 10 is an AFM image of a metal-based particle assembly 2 obtained in Inventive Example 2.

FIG. 10 is an AFM image of metal-based particle assembly 2. A calculation with reference to the AFM image indicates that metal-based particle assembly 2 was composed of silver particles having an average height of 8.5 nm.

Figure 11:
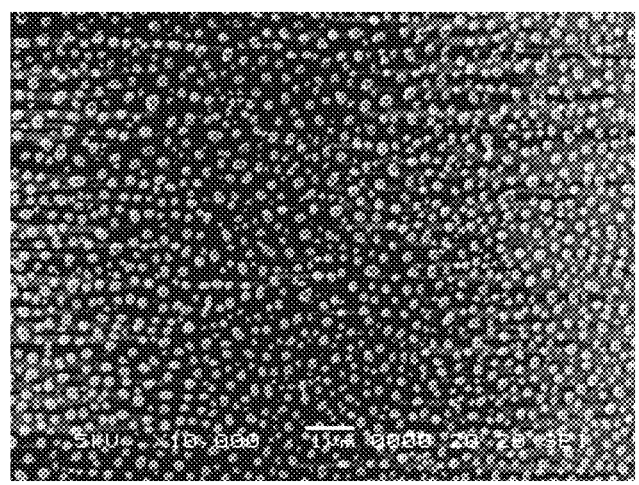
FIG. 11 shows an SEM image (as scaled 10000 times) of a metal-based particle assembly 4 obtained in Inventive Example 4, as observed from directly above.
Figure 12:
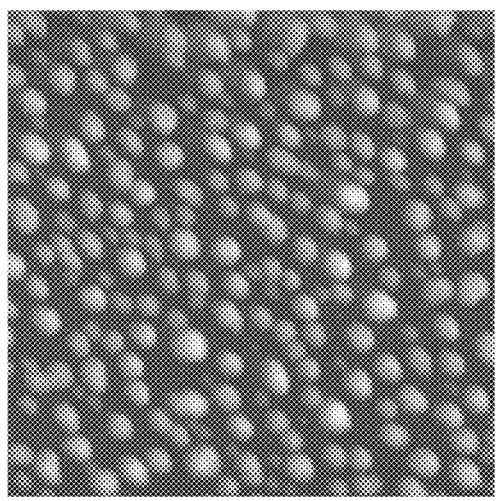
FIG. 12 is an AFM image of metal-based particle assembly 4 obtained in Inventive Example 4.

FIG. 11 is an SEM image enlarged (as scaled 10000 times) of metal-based particle assembly 4, as observed from directly above. Furthermore, FIG. 12 is an AFM image of metal-based particle assembly 4. A calculation with reference to the FIG. 11 SEM image indicates that metal-based particle assembly 4 was composed of silver particles having an average particle diameter of 278 nm and an average interparticle distance of 195.5 nm. Furthermore, from the FIG. 12 AFM image, an average height of 99.5 nm was obtained. From these values the silver particle's aspect ratio (average particle diameter/average height) was calculated to be 2.79 and it can also be found from the obtained images that the silver particles have an oblate shape. Furthermore, it can be seen from the SEM image that metal-based particle assembly 4 has approximately $2.18 \times 10^{10}$ silver particles (approximately 8.72 particles/$\mu m^2$).

Furthermore, metal-based particle assemblies 2 to 4 each had a surface connected to a tester [multimeter "E2378A" produced by Hewlett Packard Co.] to confirm conduction, and they have been found to be non-conductive.

(2) Measuring Absorption Spectra of Metal-Based Particle Assemblies 2 to 4

Figure 13:
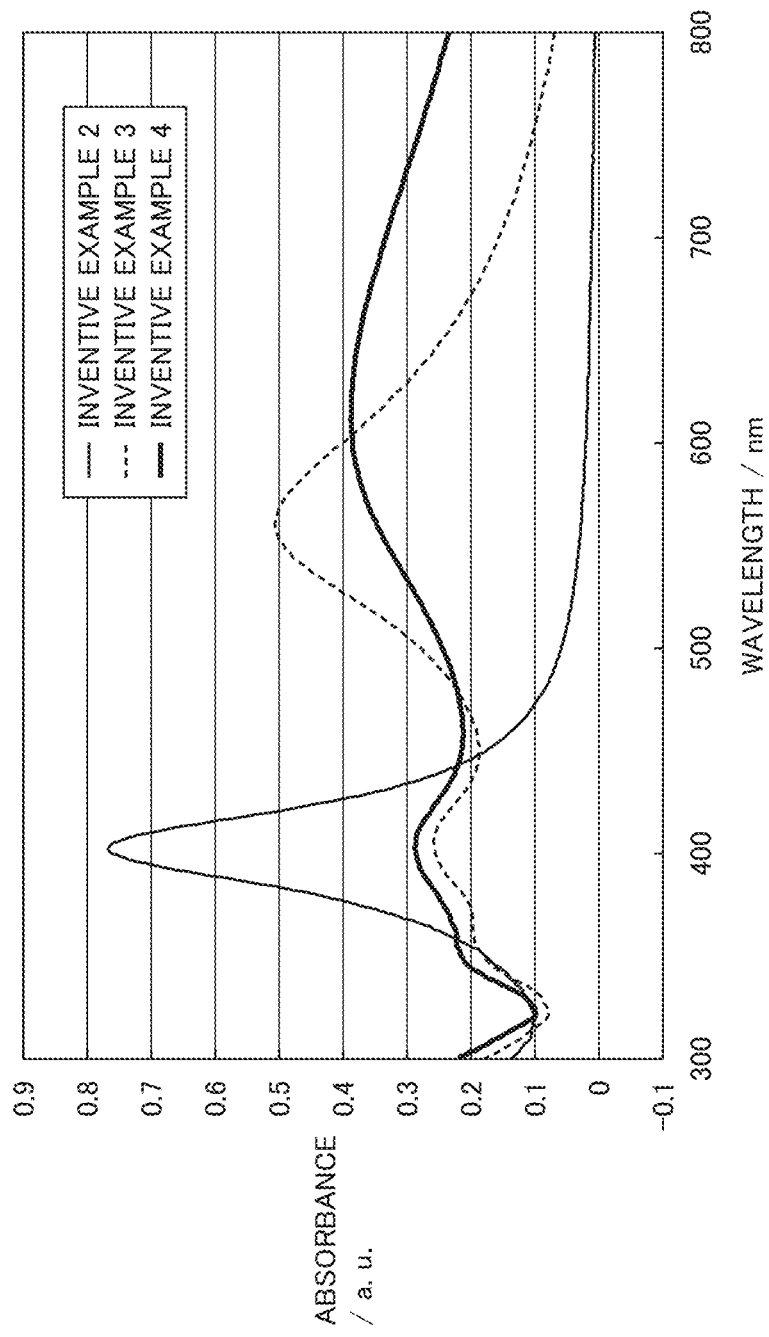
FIG. 13 represents absorption spectra of metal-based particle assemblies 2 to 4 obtained in Inventive Examples 2 to 4.

FIG. 13 represents absorption spectra, as measured through absorptiometry, of metal-based particle assemblies 2 to 4 (each layered on a substrate). The absorption spectra were measured in the same manner as FIG. 6. Metal-based particle assemblies 2 to 4 all present a plasmon peak at a longest side in wavelength for the visible light region with a maximum wavelength, for which an absorbance of approximately 0.4 or larger is presented, and it can be seen that they present intense plasmon resonance. These metal-based particle assemblies can thus be applied to plasmonic material, e.g., for an analysis and a coloring material, as has been previously discussed. Furthermore, they can also be used for example as an enhancement element for improving a light emitting device in luminous efficiency and a photoelectric conversion device in conversion efficiency.

Furthermore, it can be seen from the FIG. 13 absorption spectra that adjusting the coating liquid's silver nanoparticle concentration and, in turn, the silver film's average thickness before the heat treatment, allows a plasmon peak to have a maximum wavelength controlled over a wide range. Allowing a plasmon peak to have a maximum wavelength controlled to a desired wavelength is useful for example in that for a coloring material it can provide a color tone matching a desired application and for analysis it can adjust wavelength to match a target to be analyzed and thus allows an analysis of highly sensitivity.

Inventive Example 5-1

The same method as Inventive Example 1 was employed to provide metal-based particle assembly 1-2 on a 0.5 mm thick soda glass substrate. Thereafter immediately a spin-on glass (SOG) solution was applied with spin-coating on metal-based particle assembly 1-2 to provide an insulating layer having an average thickness of 10 nm layered thereon. For the SOG solution was used "OCD T-7 5500T", an organic SOG material produced by TOKYO OHKA KOGYO CO., LTD., which was then diluted with ethanol. An "average thickness" as referred to herein is an average of values in thickness of a layer that are obtained at any five points when the soda glass substrate is directly spin-coated with a coating liquid under the same conditions (for example on the same area, with the same composition, and in the same amount) as when the layer is provided on a metal-based particle assembly.

Then a solution for an $Alq_3$ light emitting layer was applied with spin-coating on the insulating layer to form the $Alq_3$ light emitting layer having an average thickness of 30 nm to obtain a photoexcited light emitting device. The solution for the $Alq_3$ light emitting layer was prepared by dissolving $Alq_3$ (Tris-(8-hydroxyquinoline)aluminum from Sigma Aldrich Co. LLC.) in chloroform to have a concentration of 0.5% by weight.

Inventive Example 5-2

A light emitting device was produced similarly as done in Inventive Example 5-1 except that the insulating layer had an average thickness of 30 nm.

Inventive Example 5-3

A light emitting device was produced similarly as done in Inventive Example 5-1 except that the insulating layer had an average thickness of 80 nm.

Inventive Example 5-4

A light emitting device was produced similarly as done in Inventive Example 5-1 except that the insulating layer had an average thickness of 150 nm.

Figure 14A:
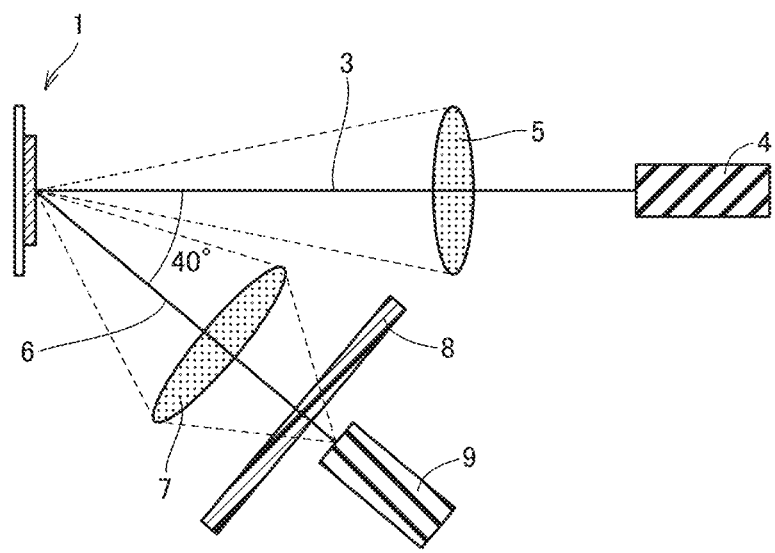
FIG. 14A schematically shows a system to measure an emission spectrum of a photoexcited light emitting device.
Figure 14B:
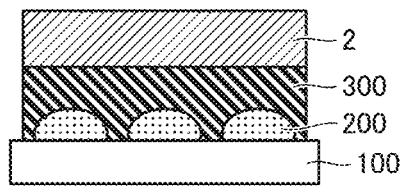
FIG. 14B is a schematic cross section of a photoexcited light emitting device having a metal-based particle assembly and an insulating layer.

The photoexcited light emitting devices respectively of Inventive Examples 5-1, 5-2, 5-3, and 5-4 were assessed for emission enhancement in level, as follows: With reference to FIG. 14A showing a system employed to measure the photoexcited light emitting devices' emission spectra and FIG. 14B showing a schematic cross section of a photoexcited light emitting device, a photoexcited light emitting device 1 was exposed at a light emitting layer 2 to excitation light 3 in a direction perpendicular to a surface of light emitting layer 2 to cause photoexcited light emitting device 1 to emit light. For an excitation light source 4 was used a UV-LED (UV-LED375-nano produced by SOUTH WALKER, excitation light wavelength: 375 nm) to emit light which was in turn condensed by a lens 5 to obtain excitation light 3 for radiation. Light 6 emitted from photoexcited light emitting device 1 and radiated in a direction of 40 degrees relative to the optical axis of excitation light 3 was condensed by a lens 7 and then transmitted through a wavelength cut-off filter 8 (SCF-505-44Y produced by SIGMA KOKI Co., LTD) to have the light of the wavelength of the excitation light cut and was then detected via a spectrophotometer 9 (MCPD-3000 produced by Otsuka Electronics Co., Ltd.). FIG. 14B is a schematic cross section of photoexcited light emitting device 1 including on substrate 100 of soda glass a metal-based particle assembly 200, an insulating layer 300, and light emitting layer 2 provided in this order.

From the spectra of the emissions detected, integrals were obtained for the emission wavelength ranges. The respective integrals obtained from each emission spectrum of the photoexcited light emitting devices of Inventive Examples 5-1, 5-2, 5-3 and 5-4 were divided by the integral obtained from an emission spectrum of a reference photoexcited light emitting device, which is identical to those of Inventive Examples 5-1 to 5-4 except that it excludes a metal-based particle assembly and an insulating layer, to obtain "emission enhancement magnification", as represented in FIG. 15 along the axis of ordinate.

Inventive Example 6

An aqueous silver nanoparticle dispersion (produced by Mitsubishi Paper Mills, Ltd., silver nanoparticle concentration: 25% by weight; and silver nanoparticle's average particle diameter: 15 nm) was diluted with pure water to have a silver nanoparticle concentration of 2% by weight. Then to the diluted aqueous silver nanoparticle dispersion 1% by volume of a surfactant was added and sufficiently agitated and thereafter to the obtained aqueous silver nanoparticle dispersion 80% by volume of acetone was added and sufficiently agitated at ordinary temperature to prepare a coating liquid. The coating liquid has a silver nanoparticle concentration of 1.2% by weight.

Then, the coating liquid was applied with spin-coating at 1500 rpm on a 1 mm thick soda glass substrate having a surface wiped with acetone and thereafter the substrate was left as it was in the air for 1 minute. The obtained silver film had an average thickness of 18.0 nm. Subsequently, the soda glass substrate having the silver film was introduced into an electric furnace of 285° C. and underwent a heat treatment (or was annealed) therein in an atmosphere of air for 5 minutes to obtain a metal-based particle assembly 6.

Inventive Example 7

On a 1 mm thick soda glass substrate a silver film was deposited through vacuum vapor deposition with a pressure of $2 \times 10^{-3}$ Pa applied. The obtained vapor-deposited silver film had an average thickness of 15.0 nm. Subsequently, the soda glass substrate having the vapor-deposited silver film was introduced into an electric furnace of 350° C. and underwent a heat treatment (or was annealed) therein in an atmosphere of air for 5 minutes to obtain a metal-based particle assembly 7.

Figure 16:
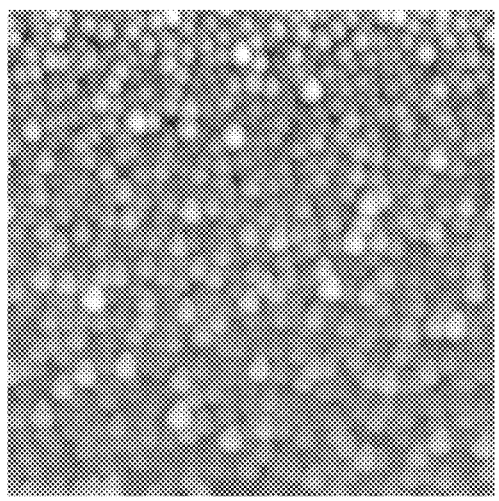
FIG. 16 is an AFM image of a metal-based particle assembly 6 obtained in Inventive Example 6.
Figure 17:
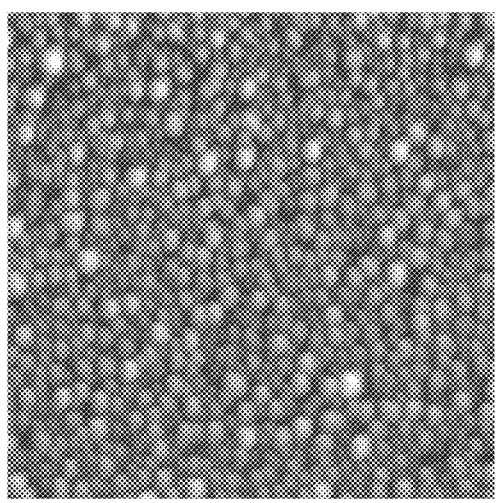
FIG. 17 is an AFM image of a metal-based particle assembly 7 obtained in Inventive Example 7.
Figure 18:
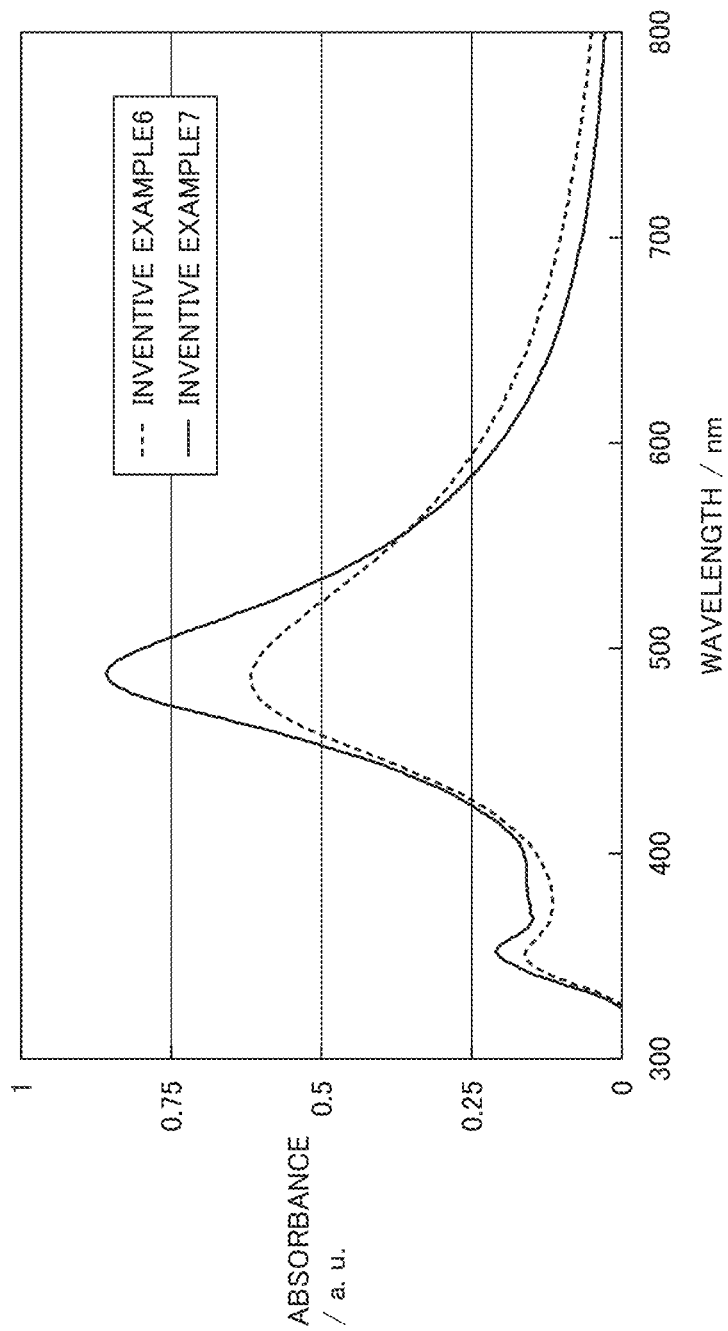
FIG. 18 represents absorption spectra of metal-based particle assemblies 6 and 7 obtained in Inventive Examples 6 and 7.

FIGS. 16 and 17 are AFM images of metal-based particle assemblies 6 and 7 obtained in Inventive Examples 6 and 7, respectively. Furthermore, FIG. 18 represents absorption spectra, as measured through absorptiometry, of metal-based particle assemblies 6 and 7 (each layered on a substrate). The absorption spectra were measured in the same manner as FIG. 6. As shown in FIG. 18, metal-based particle assemblies 6 and 7 both present a plasmon peak at a longest side in wavelength for the visible light region with a maximum wavelength, for which an absorbance of approximately 0.6 or larger is presented, and it can be seen that they present intense plasmon resonance. Thus, these metal-based particle assemblies can be used as a plasmonic material, for example as an enhancement element for improving a light emitting device in luminous efficiency and a photoelectric conversion device in conversion efficiency. Furthermore, it has been found that when the metal-based film has an average thickness of approximately 30 nm or smaller, even a heat treatment in a relatively low temperature range can also be performed to obtain a metal-based particle assembly presenting intense plasmon peak (or a high plasmon resonance effect).

Comparative Examples 1 and 2

On a 1 mm thick soda glass substrate a silver film was deposited through vacuum vapor deposition with a pressure of $2\times10^{-3}$ Pa applied. The obtained vapor-deposited silver film had an average thickness of 56.0 nm. Subsequently, the soda glass substrate having the vapor-deposited silver film was introduced into an electric furnace of 300° C. and underwent a heat treatment (or was annealed) therein in an atmosphere of air for 5 minutes to obtain a silver film H1 (for Comparative Example 1).

Furthermore, except that the vapor deposition was provided under an adjusted condition to provide a vapor-deposited silver film having an average thickness of 71.0 nm, a manner similar to Comparative Example 1 was used to obtain a silver film H2 (for Comparative Example 2).

Figure 19:
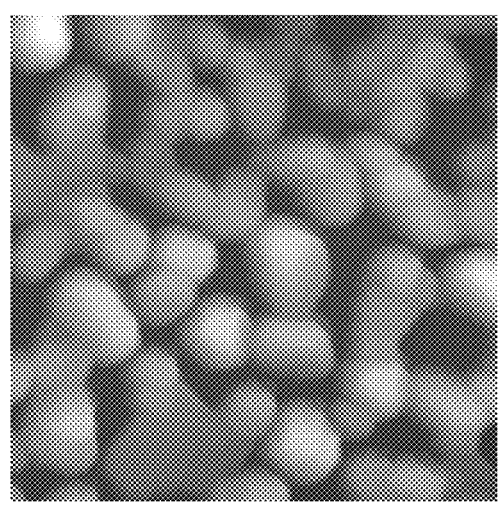
FIG. 19 is an AFM image of a silver film H1 obtained in Comparative Example 1.
Figure 20:
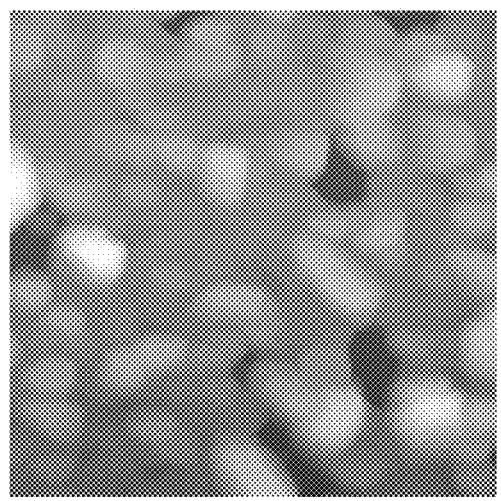
FIG. 20 is an AFM image of a silver film H2 obtained in Comparative Example 2.
Figure 21:
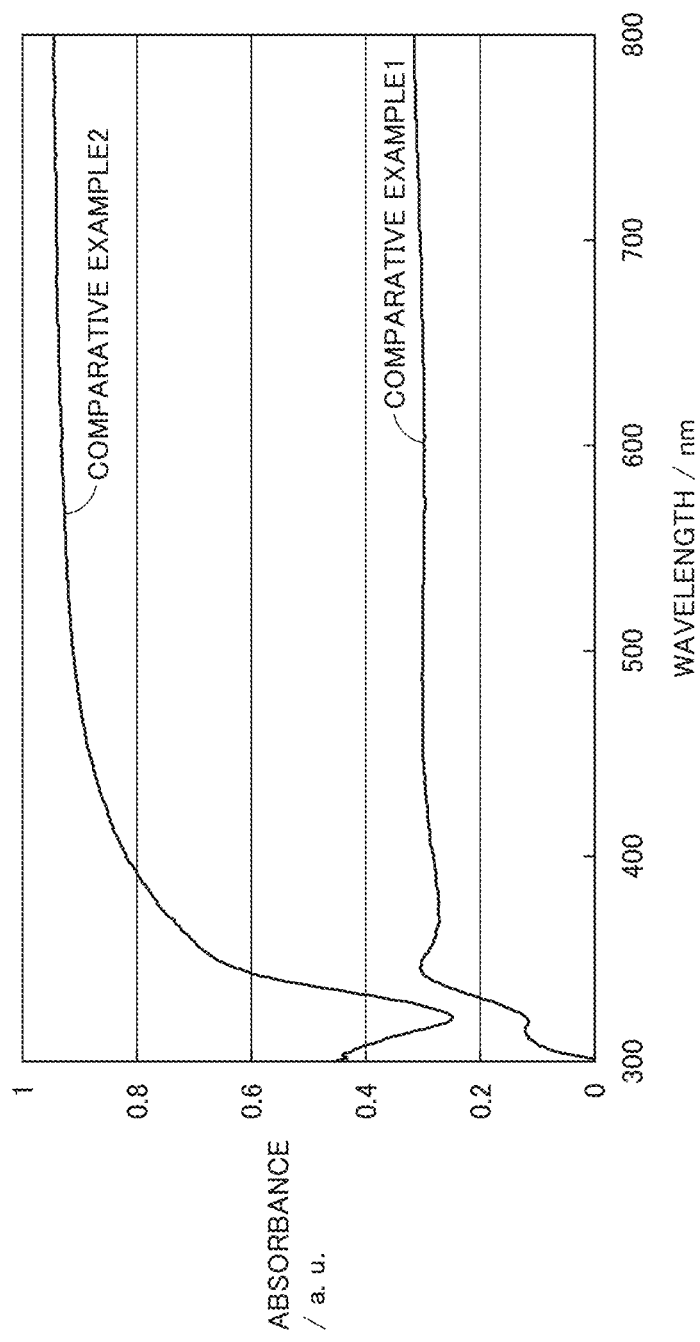
FIG. 21 represents absorption spectra of silver films H1 and H2 obtained in Comparative Examples 1 and 2.

FIGS. 19 and 20 are AFM images of silver films H1 and H2 obtained in Comparative Examples 1 and 2, respectively. Furthermore, FIG. 21 represents absorption spectra, as measured through absorptiometry, of silver films H1 and H2 (each layered on a substrate). The absorption spectra were measured in the same manner as FIG. 6. As shown in FIG. 19 and FIG. 20, it has been found that a metal-based film having an average thickness exceeding 50 nm before the heat treatment is at least partially unchanged morphologically into a metal-based particle assembly.

Inventive Example 8 and Comparative Example 3

On a 1 mm thick soda glass substrate a silver film was deposited through vacuum vapor deposition with a pressure of $2\times10^{-3}$ Pa applied. The obtained vapor-deposited silver film had an average thickness of 39.0 nm. Subsequently, the soda glass substrate having the vapor-deposited silver film was introduced into an electric furnace of 500° C. and underwent a heat treatment (or was annealed) therein in an atmosphere of air for 5 minutes to obtain a metal-based particle assembly 8 (as Inventive Example 8). Furthermore, except that the vapor deposition was provided under an adjusted condition to provide a vapor-deposited silver film having an average thickness of 56.0 nm, a manner similar to Inventive Example 8 was used to obtain a silver film H3 (for Comparative Example 3).

Figure 22:
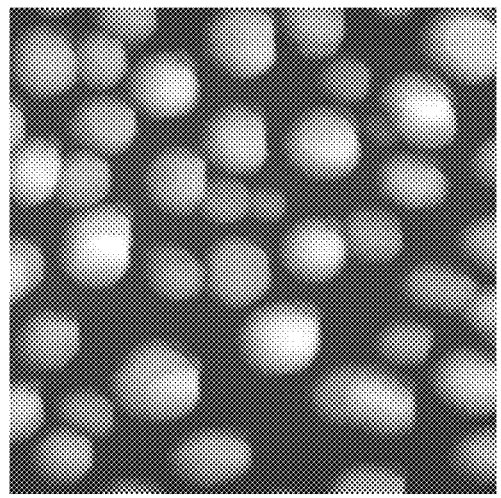
FIG. 22 is an AFM image of a metal-based particle assembly 8 obtained in Inventive Example 8.
Figure 23:
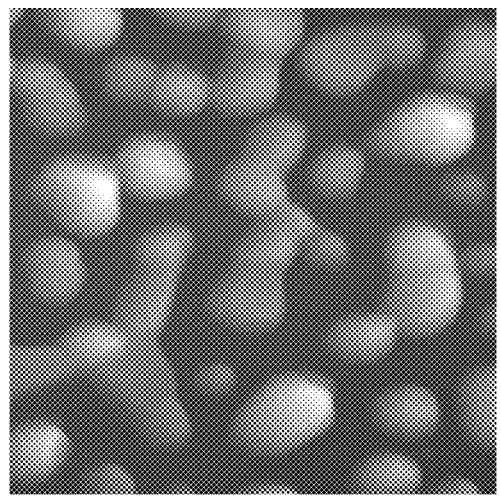
FIG. 23 is an AFM image of a silver film H3 obtained in Comparative Example 3.
Figure 24:
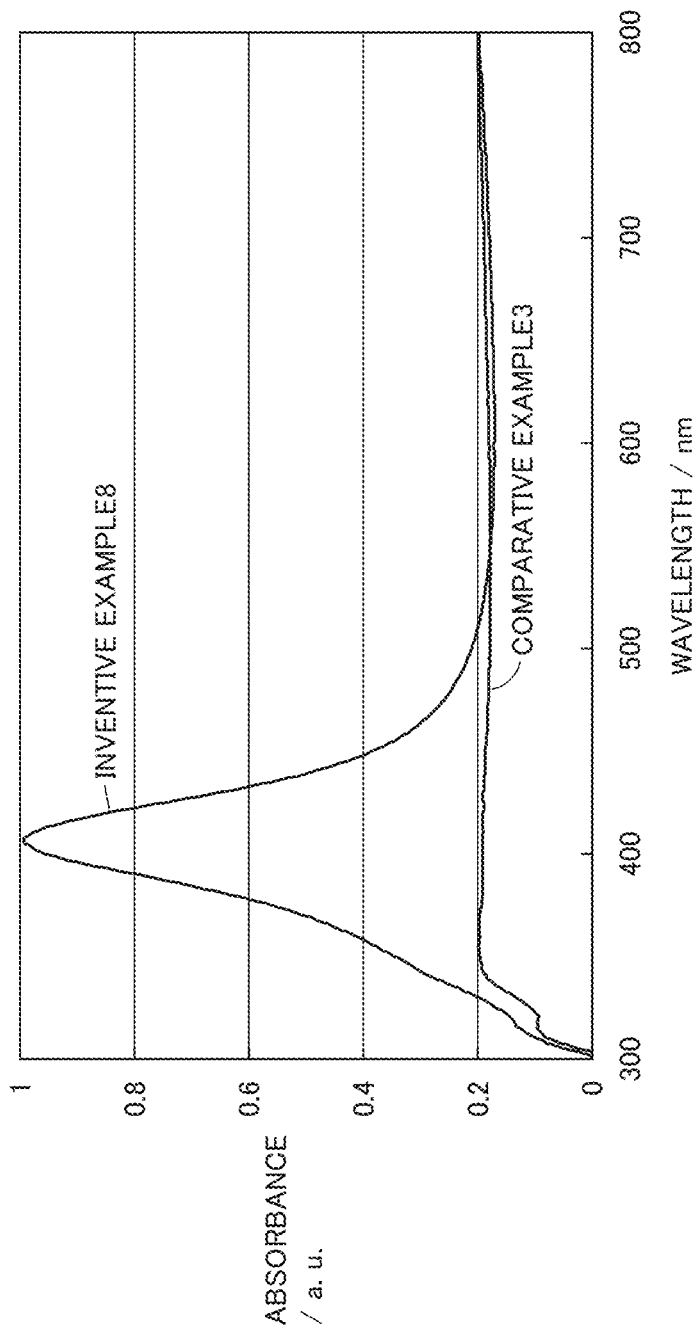
FIG. 24 represents absorption spectra of metal-based particle assembly 8 and silver film H3 obtained in Inventive Example 8 and Comparative Example 3.

FIGS. 22 and 23 are AFM images of metal-based particle assembly 8 and silver film H3 obtained in Inventive Example 8 and Comparative Example 3, respectively. Furthermore, FIG. 24 represents absorption spectra, as measured through absorptiometry, of metal-based particle assembly 8 and silver film H3 (each layered on a substrate). The absorption spectra were measured in the same manner as FIG. 6. As shown in FIG. 23, it has been found that a metal-based film having an average thickness exceeding 50 nm before the heat treatment is at least partially unchanged morphologically into a metal-based particle assembly even when the heat treatment is performed in the high temperature range. Furthermore, it has been found from the FIG. 22 AFM image and the FIG. 24 absorption spectra that a metal-based film having an average thickness which, on one hand, exceeds 30 nm and, on the other hand, is 50 nm or smaller before the heat treatment allows through the heat treatment in the high temperature range a metal-based particle assembly to be obtained that can present an intense plasmon resonance effect.

REFERENCE SIGNS LIST

1: photoexcited light emitting device, 2: light emitting layer, 3: excitation light, 4: excitation light source, 5, 7: lens, 6: light emitted from photoexcited light emitting device, 8: wavelength cut off filter, 9: spectrophotometer, 100: substrate, 200: metal-based particle assembly, 201: metal-based particle, 250: metal-based film, 255: surface region of metal-base film thermally decomposed, 300: insulating layer, 400: resist, 401: circular opening, 410: silver film, 500: metal-based particle assembly-layered substrate, 501: substrate, 502: metal-based particle assembly, 600: objective lens, 700: spectrophotometer.

The invention claimed is:

1. A method for producing a metal-based particle assembly, comprising:
   a first step of producing a metal-based film having an average thickness equal to or smaller than 50 nm on a substrate; and
   a second step of morphologically changing said metal-based film through a heat treatment into a metal-based particle assembly comprising a plurality of metal-based particles mutually separated and disposed in two dimensions, the second step being performed in an oxidizing atmosphere.

2. The method for producing a metal-based particle assembly according to claim 1, wherein said heat treatment is performed at a temperature equal to or higher than 280° C.

3. The method for producing a metal-based particle assembly according to claim 1, wherein said first step includes the step of applying a coating liquid on said substrate, said coating liquid containing particles made of a metal-based material that constitutes said metal-based film.

4. The method of producing a metal-based particle assembly according to claim 3, wherein said coating liquid contains said particles at a concentration of 0.1-7% by weight.

5. The method for producing a metal-based particle assembly according to claim 1, wherein said first step includes the step of producing said metal-based film on said substrate through vapor deposition.

6. The method for producing a metal-based particle assembly according to claim 1, wherein a series of steps including said first step followed by said second step is repeated at least twice.

7. The method for producing a metal-based particle assembly according to claim 1, wherein:
said metal-based particle assembly includes 30 or more said metal-based particles; and
said metal-based particles have an average particle diameter in a range of from 200 to 1600 nm, an average height in a range of from 55 to 500 nm, and an aspect ratio, as defined by a ratio of said average particle diameter to said average height, in a range of from 1 to 8, and said metal-based particles are disposed such that immediately adjacent ones thereof have an average distance therebetween in a range of from 1 to 150 nm.

8. The method for producing a metal-based particle assembly according to claim 1, wherein:
said metal-based particle assembly includes 30 or more said metal-based particles;
said metal-based particles have an average particle diameter in a range of from 200 to 1600 nm, an average height in a range of from 55 to 500 nm, and an aspect ratio, as defined by a ratio of said average particle diameter to said average height, in a range of from 1 to 8; and
said metal-based particle assembly has in an absorption spectrum for a visible light region a maximum wavelength of a peak at a longest side in wavelength, and said maximum wavelength shifts toward a shorter side in wavelength in a range of from 30 to 500 nm as compared with that of a reference metal-based particle assembly in which metal-based particles having a particle diameter equal to said average particle diameter and a height equal to said average height and being identical in material to those of the former metal-based particle assembly are disposed such that each distance between adjacent metal-based particles may be in a range of from 1 to 2 μm.

9. The method for producing a metal-based particle assembly according to claim 1, wherein:
said metal-based particle assembly includes 30 or more said metal-based particles;
said metal-based particles have an average particle diameter in a range of from 200 to 1600 nm, an average height in a range of from 55 to 500 nm, and an aspect ratio, as defined by a ratio of said average particle diameter to said average height, in a range of from 1 to 8; and
said metal-based particle assembly has in an absorption spectrum for a visible light region a maximum wavelength of a peak at a longest side in wavelength, and an absorbance at said maximum wavelength is higher as compared with that of a reference metal-based particle assembly in which metal-based particles having a particle diameter equal to said average particle diameter and a height equal to said average height and being identical in material to those of the former metal-based particle assembly are disposed such that each distance between adjacent metal-based particles may be in a range of from 1 to 2 μm, on the premise that the numbers of said metal-based particles are the same.

10. The method for producing a metal-based particle assembly according to claim 1, wherein said metal-based particles are made of noble metal.

11. The method for producing a metal-based particle assembly according to claim 10, wherein said metal-based particles are made of silver.

* * * * *